United States Patent
Chen et al.

(10) Patent No.: US 10,515,884 B2
(45) Date of Patent: Dec. 24, 2019

(54) SUBSTRATE HAVING A CONDUCTIVE STRUCTURE WITHIN PHOTO-SENSITIVE RESIN

(71) Applicant: Advanced Semiconductor Engineering, Inc., Kaosiung (TW)

(72) Inventors: Tien-Szu Chen, Kaohsiung (TW); Kuang-Hsiung Chen, Kaohsiung (TW); Sheng-Ming Wang, Kaohsiung (TW); Yu-Ying Lee, Kaohsiung (TW); Li-Chuan Tsai, Kaohsiung (TW); Chih-Cheng Lee, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 52 days.

(21) Appl. No.: 14/624,388

(22) Filed: Feb. 17, 2015

(65) Prior Publication Data
US 2016/0240462 A1 Aug. 18, 2016

(51) Int. Cl.
*H01L 23/498* (2006.01)
*H01L 21/48* (2006.01)
*H01L 23/31* (2006.01)

(52) U.S. Cl.
CPC ...... *H01L 23/49827* (2013.01); *H01L 21/486* (2013.01); *H01L 23/49816* (2013.01);
(Continued)

(58) Field of Classification Search
CPC .......... H01L 23/49811; H01L 21/4828; H01L 21/4846; H01L 21/4853; H01L 21/486;
(Continued)

(56) References Cited

U.S. PATENT DOCUMENTS

| | | | |
|---|---|---|---|
| 5,656,550 A * | 8/1997 | Tsuji | H01L 21/565 257/786 |
| 6,291,778 B1 * | 9/2001 | Asai | H05K 1/112 174/263 |

(Continued)

FOREIGN PATENT DOCUMENTS

| | | |
|---|---|---|
| CN | 101106121 A | 1/2008 |
| CN | 101179062 A | 5/2008 |

(Continued)

OTHER PUBLICATIONS

Office Action and Search Report for Chinese Patent Application No. 201310394695.1, dated Apr. 12, 2017, 7 pages.
(Continued)

*Primary Examiner* — Peter Bradford
(74) *Attorney, Agent, or Firm* — Foley & Lardner LLP; Cliff Z. Liu

(57) ABSTRACT

The present disclosure relates to a semiconductor substrate structure, semiconductor package and method of manufacturing the same. The semiconductor substrate structure includes a conductive structure, a dielectric structure and a metal bump. The conductive structure has a first conductive surface and a second conductive surface. The dielectric structure has a first dielectric surface and a second dielectric surface. The first conductive surface does not protrude from the first dielectric surface. The second conductive surface is recessed from the second dielectric surface. The metal bump is disposed in a dielectric opening of the dielectric structure, and is physically and electrically connected to the second conductive surface. The metal bump has a concave surface.

25 Claims, 38 Drawing Sheets

(52) U.S. Cl.
CPC .... *H01L 23/49822* (2013.01); *H01L 23/3128* (2013.01); *H01L 2224/16* (2013.01); *H01L 2224/48091* (2013.01); *H01L 2224/73265* (2013.01); *H01L 2924/181* (2013.01)

(58) Field of Classification Search
CPC ............. H01L 23/498; H01L 23/49827; H01L 23/49838
See application file for complete search history.

(56) References Cited

U.S. PATENT DOCUMENTS

| | | | |
|---|---|---|---|
| 6,525,413 B1* | 2/2003 | Cloud | H01L 25/0652 257/686 |
| 7,705,245 B2 | 4/2010 | Miyamoto et al. | |
| 7,880,091 B2 | 2/2011 | Miyamoto et al. | |
| 7,939,935 B2 | 5/2011 | Chinda et al. | |
| 8,101,864 B2 | 1/2012 | Chinda et al. | |
| 8,230,591 B2 | 7/2012 | Chinda et al. | |
| 2003/0127499 A1* | 7/2003 | Pierson | B23K 26/362 228/246 |
| 2007/0034401 A1 | 2/2007 | Shim et al. | |
| 2008/0012140 A1 | 1/2008 | Tsukano et al. | |
| 2008/0190658 A1* | 8/2008 | Toyoda | H01L 21/486 174/263 |
| 2008/0197173 A1* | 8/2008 | Kitae | H01L 21/4853 228/180.22 |
| 2008/0202803 A1 | 8/2008 | Nagase et al. | |
| 2009/0146303 A1* | 6/2009 | Kwon | H01L 23/49816 257/741 |
| 2011/0001215 A1* | 1/2011 | Lam | H01L 21/568 257/531 |
| 2011/0039375 A1 | 2/2011 | Nakagawa et al. | |
| 2011/0042803 A1* | 2/2011 | Chu | H01L 21/76898 257/737 |
| 2011/0266671 A1* | 11/2011 | Youm | H01L 23/498 257/738 |
| 2011/0316169 A1* | 12/2011 | Sunohara | H01L 21/486 257/774 |
| 2012/0001306 A1* | 1/2012 | Wang | H01L 21/2885 257/666 |
| 2012/0092834 A1* | 4/2012 | Tain | H01L 23/3677 361/717 |
| 2012/0199389 A1* | 8/2012 | Furutani | H01L 21/486 174/264 |
| 2014/0021636 A1 | 1/2014 | Su et al. | |
| 2014/0231989 A1* | 8/2014 | Pagaila | H01L 21/568 257/737 |
| 2015/0076682 A1* | 3/2015 | Wu | H01L 23/3675 257/693 |
| 2015/0235991 A1* | 8/2015 | Gu | H01L 25/0655 257/762 |
| 2016/0021758 A1* | 1/2016 | Furutani | H05K 3/103 174/251 |
| 2016/0043024 A1* | 2/2016 | Furutani | H01L 23/49827 361/783 |
| 2016/0133551 A1* | 5/2016 | Hsiao | H01L 23/49811 257/737 |
| 2016/0307799 A1* | 10/2016 | Ho | H01L 21/324 |

FOREIGN PATENT DOCUMENTS

| | | |
|---|---|---|
| CN | 101257004 A | 9/2008 |
| CN | 101996902 A | 3/2011 |
| CN | 102157476 A | 8/2011 |
| WO | WO-2013/070207 A1 | 5/2013 |

OTHER PUBLICATIONS

Translation of Search Report for Chinese Patent Application No. 201310394695.1, dated Apr. 12, 2017, 2 pages.
Office Action and Search Report for Chinese Patent Application No. 201310394695.1, dated Oct. 20, 2017, 8 pages.
Translation of Search Report for Chinese Patent Application No. 201310394695.1, dated Oct. 20, 2017, 4 pages.

* cited by examiner

SUBSTRATE HAVING A CONDUCTIVE STRUCTURE WITHIN PHOTO-SENSITIVE RESIN

BACKGROUND

1. Technical Field

The present disclosure relates to a semiconductor substrate structure, semiconductor package and method of manufacturing the same, and, more particularly, to a semiconductor substrate structure including a metal bump for connecting a solder bump, a semiconductor package including the same and method of manufacturing the same.

2. Description of the Related Art

Design trends in the semiconductor industry include weight reduction and miniaturization of semiconductor products. However, techniques for weight reduction and miniaturization may result in manufacturing problems. For example, fine pitch conductive traces can result in low yield during manufacturing, thin semiconductor substrate structure is difficult to handle because it is too soft, the use of underfill in flip-chip bonding can be high cost, and solder bumps may be easy to crack. In addition, the side rail of a semiconductor substrate strip has a risk of damage or cracking during assembly when a thin semiconductor substrate structure is used.

Therefore, it is desirable to provide a semiconductor substrate structure, semiconductor package and method of manufacturing the same that can solve the above problems.

SUMMARY

One aspect of the present disclosure relates to a semiconductor substrate structure. In one embodiment, the semiconductor substrate structure comprises a conductive structure, a dielectric structure and a metal bump. The conductive structure has a first conductive surface and a second conductive surface opposite to the first conductive surface. The dielectric structure covers at least a portion of the conductive structure, and has a first dielectric surface and a second dielectric surface opposite to the first dielectric surface. The first conductive surface does not protrude from the first dielectric surface. The second conductive surface is recessed from the second dielectric surface. The dielectric structure defines a dielectric opening on the second dielectric surface to expose a portion of the second conductive surface. The metal bump is disposed in the dielectric opening, and physically and electrically connected to the second conductive surface. The metal bump has a concave surface.

Another aspect of the present disclosure relates to a semiconductor package. In one embodiment, the semiconductor package comprises a semiconductor substrate structure, a semiconductor die, an encapsulant and a solder bump. The semiconductor substrate structure comprises a conductive structure, a dielectric structure and a metal bump. The conductive structure has a first conductive surface and a second conductive surface opposite to the first conductive surface. The dielectric structure covers at least a portion of the conductive structure, and has a first dielectric surface and a second dielectric surface opposite to the first dielectric surface. The first conductive surface does not protrude from the first dielectric surface. The second conductive surface is recessed from the second dielectric surface. The dielectric structure defines a dielectric opening on the second dielectric surface to expose a portion of the second conductive surface. The metal bump is disposed in the dielectric opening, and is physically and electrically connected to the second conductive surface. The metal bump has a concave surface. The semiconductor die is electrically connected to the first conductive surface. The encapsulant covers the semiconductor die and a portion of the semiconductor substrate structure. The solder bump is disposed in the dielectric opening, and is physically and electrically connected to the metal bump. The solder bump protrudes from the second dielectric surface.

Another aspect of the present disclosure relates to a method for manufacturing a semiconductor package. In one embodiment, the method comprises the steps of: providing a semiconductor substrate structure, wherein the semiconductor substrate structure comprises: a conductive structure having a first conductive surface and a second conductive surface opposite to the first conductive surface; a dielectric structure covering at least a portion of the conductive structure, and having a first dielectric surface and a second dielectric surface opposite to the first dielectric surface, wherein the first conductive surface does not protrude from the first dielectric surface, the second conductive surface is recessed from the second dielectric surface, and the dielectric structure defines a dielectric opening on the second dielectric surface to expose a portion of the second conductive surface; a metal bump disposed in the dielectric opening, and physically and electrically connected to the second conductive surface, wherein the metal bump has a convex surface; and a supporting structure disposed on the second dielectric surface; electrically connecting a semiconductor die to the conductive structure; encapsulating the semiconductor die and a portion of the semiconductor substrate structure; and removing the supporting structure, so that the convex surface of the metal bump becomes a concave surface.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are specified with respect to a certain element or certain plane of an element, as described in the specification and shown in the figures. Furthermore, it should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
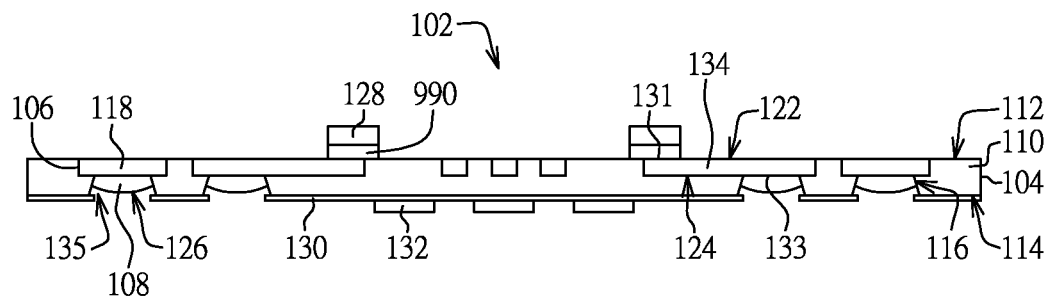
FIG. 1 illustrates a cross-sectional view of a semiconductor substrate structure according to an embodiment of the present disclosure.

FIG. 1 illustrates a cross-sectional view of a semiconductor substrate structure 102 according to an embodiment of the present disclosure. The semiconductor substrate structure 102 includes a dielectric structure 104, one or more conductive structures 106, one or more metal bumps 108 and a supporting structure 130 (for example, a metal supporting layer). In this embodiment, the dielectric structure 104 is a dielectric layer 110, and has a first dielectric surface 112, a second dielectric surface 114 opposite to the first dielectric surface 112, and one or more dielectric openings 116 on the second dielectric surface 114. The material of the dielectric layer 110 may be, for example, one of, or a combination of, pre-preg, Ajinomoto build-up film (ABF), solder resist layer, liquid crystal polymer (LCP), polyimide (PI) or photosensitive resin.

In this embodiment, the conductive structure 106 is a single-layered metal layer structure, and comprises a first patterned conductive layer 118. The first patterned conductive layer 118 comprises one or more first bonding pads 131 (bump pad), one or more second bonding pads 133 (ball pad) and first conductive traces 134. The first patterned conductive layer 118 has a first conductive surface 122 and a second conductive surface 124 opposite to the first conductive surface 122. The dielectric structure 104 (the dielectric layer 110) covers at least a portion of the conductive structure 106 (the first patterned conductive layer 118). The first conductive surface 122 does not protrude from the first dielectric surface 112, meaning that portions of, or all of, the first conductive surface 122 may be substantially coplanar with the first dielectric surface 112, or recessed from the first dielectric surface 112. The second conductive surface 124 is recessed from the second dielectric surface 114. The dielectric openings 116 expose portions of the second conductive surface 124. As illustrated for the embodiment of FIG. 1, the first conductive surface 122 is substantially coplanar with the first dielectric surface 112 of the dielectric layer 110, the first bonding pads 131 (bump pad) are exposed from the first dielectric surface 112, and the second bonding pads 133 (ball pad) are exposed in the dielectric openings 116. As illustrated, a first conductive trace 134 connects a first bonding pad 131 (bump pad) and a second bonding pad 133 (ball pad). In this embodiment, the first conductive traces 134 may be fine pitch, such as less than or equal to 15 micrometers (μm).

The metal bumps 108 are disposed in the dielectric openings 116, and are physically and electrically connected to the second conductive surface 124 of the first patterned conductive layer 118 exposed in the dielectric opening 116; thereby the metal bumps 108 are physically and electrically connected to corresponding ones of the second bonding pads 133 (ball pad). Each of the metal bumps 108 is recessed from the second dielectric surface 114, and has a bump surface 126 that is exposed in the dielectric opening 116. In the embodiment of FIG. 1, the bump surface 126 is a convex surface protruding from the metal bump 108, and there is a gap 135 formed between the bump surface 126 and the dielectric structure 104. During packaging, the metal bumps 108 can protect the circuit pattern of the first patterned conductive layer 118 from being etched. Therefore, the metal bumps 108 can avoid thinning of the circuit pattern, which can affect electrical performance. The detail will be further described below.

The supporting structure 130 (for example, a metal supporting layer) is disposed on the second dielectric surface 114 of the dielectric structure 104. In this embodiment, the supporting structure 130 is a single-layered metal layer, and is made of copper; however, the present disclosure is not limited thereto. In one embodiment, a metal supporting layer is formed of a copper foil with a thickness of about 12 μm, which can provide sufficient support force, and facilitate subsequent packaging using the thin and coreless substrate structure 102.

In one embodiment, the semiconductor substrate structure 102 may further comprise one or more conductive posts 128 and one or more thermal pads 132. The conductive posts 128 protrude from the first conductive surface 122, and are disposed on respective ones of the first bonding pads 131 (bump pad), so as to be electrically connected to the conductive structure 106. The material of the conductive posts 128 may be copper; however, the present disclosure is not limited thereto. In one embodiment, a conductive film 990 may be disposed under the conductive posts 128; however, the conductive film 990 may be omitted. The thermal pads 132 may be disposed on the supporting structure 130 (e.g., a metal supporting layer) to dissipate the heat generated from a semiconductor die during operation. The material of the thermal pad 132 may be copper; however, the present disclosure is not limited thereto.

Figure 1A:
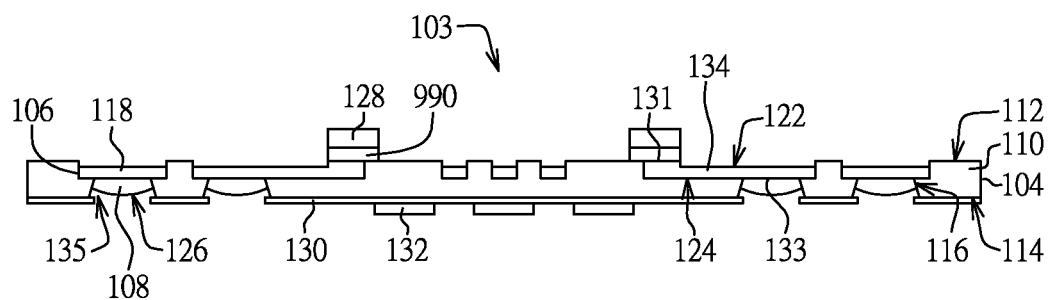
FIG. 1A illustrates a cross-sectional view of a semiconductor substrate structure according to another embodiment of the present disclosure.

FIG. 1A illustrates a cross-sectional view of a semiconductor substrate structure 103 according to another embodiment of the present disclosure. The semiconductor substrate structure 103 of this embodiment is similar to the semiconductor substrate structure 102 illustrated in FIG. 1, except that portions of the first conductive surface 122 of this embodiment is recessed from the first dielectric surface 112. In other embodiments, all of the first conductive surface 122 is recessed from the first dielectric surface 112.

Figure 2:
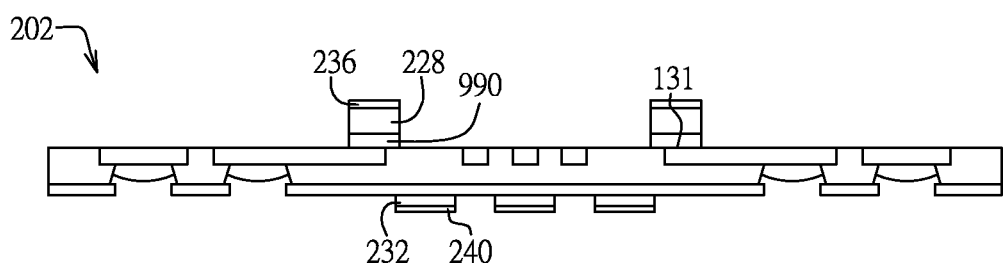
FIG. 2 illustrates a cross-sectional view of a semiconductor substrate structure according to another embodiment of the present disclosure.

FIG. 2 illustrates a cross-sectional view of a semiconductor substrate structure 202 according to another embodiment of the present disclosure. The semiconductor substrate structure 202 of this embodiment is similar to the semiconductor substrate structure 102 illustrated in FIG. 1, and the difference is described as follows. The semiconductor substrate structure 202 further comprises a surface finish layer 236 and a surface finish layer 240. The surface finish layer 236 is disposed on one or more conductive posts 228 positioned on respective ones of the first bonding pads 131 (bump pad). The surface finish layer 240 is disposed on one or more thermal pads 232. In one embodiment, the material of the surface finish layer 236 is nickel, gold or an alloy thereof, to facilitate subsequent wire bonding. In one embodiment, the material of the surface finish layer 240 is gold, silver, nickel, or an alloy thereof, which serves as an anti-etch layer to facilitate the formation of the thermal pads 232 by etching the supporting structure 130 after applying molding.

Figure 3:
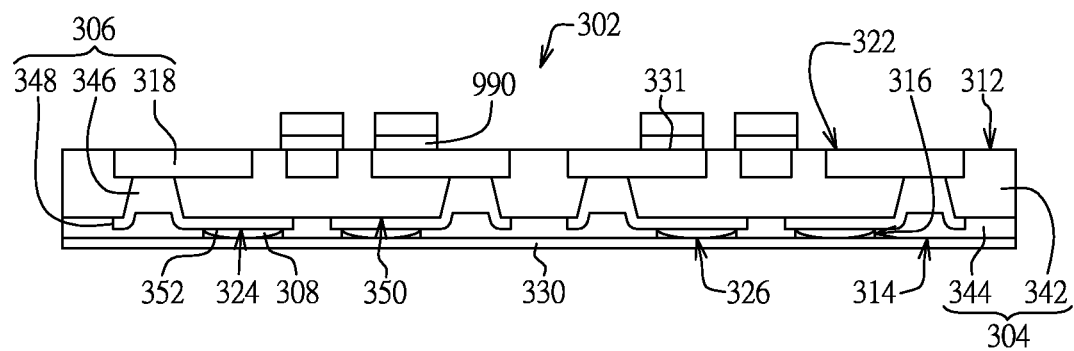
FIG. 3 illustrates a cross-sectional view of a semiconductor substrate structure according to another embodiment of the present disclosure.

FIG. 3 illustrates a cross-sectional view of a semiconductor substrate structure 302 according to another embodiment of the present disclosure. The semiconductor substrate structure 302 of this embodiment is similar to the semiconductor substrate structure 102 illustrated in FIG. 1, and the difference is described as follows. The dielectric structure 304 of the semiconductor substrate structure 302 comprises a first dielectric layer 342 and a second dielectric layer 344. The first dielectric layer 342 has a first dielectric surface 312 and a third dielectric surface 350, and the second dielectric layer 344 has a second dielectric surface 314 and one or more dielectric openings 316.

The conductive structure 306 of the semiconductor substrate structure 302 comprises a first patterned conductive layer 318, one or more conductive vias 346 and a second patterned conductive layer 348. The dielectric structure 304 covers at least a portion of the conductive structure 306. The first patterned conductive layer 318 has a first conductive surface 322 and one or more first bonding pads 331 (bump pad). The first conductive surface 322 is exposed from the first dielectric surface 312 of the first dielectric layer 342. In some embodiments such as the one illustrated in FIG. 3, the first conductive surface 322 is substantially coplanar with the first dielectric surface 312 of the first dielectric layer 342, and the first bonding pads 331 (bump pad) are exposed from the first dielectric surface 312. In other embodiments, the first conductive surface 322 is recessed from the first dielectric surface 312 of the first dielectric layer 342. The second patterned conductive layer 348 is disposed on the third dielectric surface 350. The second patterned conductive layer 348 has a second conductive surface 324 and one or more second bonding pads 352 (ball pad). The second conductive surface 324 is recessed from the second dielectric surface 314. One or more dielectric openings 316 expose a portion of the second conductive surface 324. The second bonding pads 352 (ball pad) are exposed in respective ones of the dielectric openings 316. The conductive vias 346 extend through the first dielectric layer 342 of the dielectric structure 304 and electrically connect the first patterned conductive layer 318 and the second patterned conductive layer 348.

One or more metal bumps 308 of the semiconductor substrate structure 302 are disposed in respective ones of the dielectric openings 316, and physically and electrically connected to the second conductive surface 324 of the second patterned conductive layer 348; thereby, the metal bumps 308 are physically and electrically connected to respective ones of the second bonding pad 352 (ball pad) exposed in the dielectric openings 316. Each metal bump 308 has a bump surface 326 that is exposed in the dielectric opening 316. In the embodiment of FIG. 3, the bump surface 326 is a convex surface protruding from the metal bump 308. During packaging, the metal bumps 308 can protect the second patterned conductive layer 348 from being etched. Therefore, the metal bumps 308 can avoid thinning of the second patterned conductive layer 348, which can affect electrical performance. The detail will be further described below.

A supporting structure 330 (for example, a metal supporting layer) is disposed on the second dielectric surface 314 of the second dielectric layer 344. In an embodiment, the supporting structure 330 is made of copper; however, the present disclosure is not limited thereto. In one embodiment, a metal supporting layer is formed of a copper foil with a thickness of about 12 μm, which can provide sufficient support force, and facilitate subsequent packaging using the thin and coreless substrate structure 302.

Figure 4:
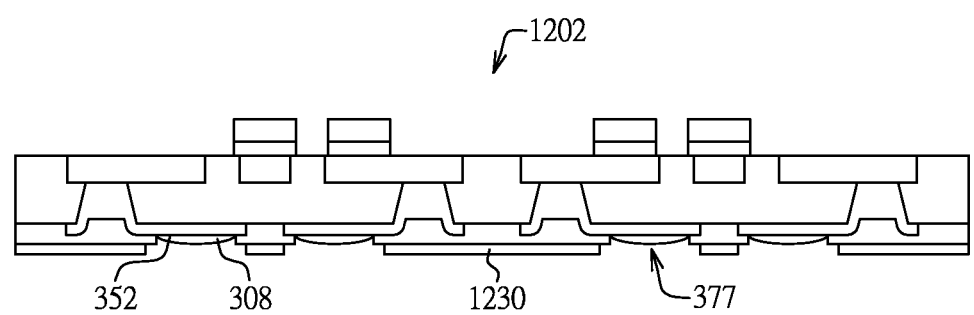
FIG. 4 illustrates a cross-sectional view of a semiconductor substrate structure according to another embodiment of the present disclosure.

FIG. 4 illustrates a cross-sectional view of a semiconductor substrate structure 1202 according to another embodiment of the present disclosure. The semiconductor substrate structure 1202 of this embodiment is similar to the semiconductor substrate structure 302 illustrated in FIG. 3, and the difference is described as follows. A supporting structure 1230 (for example, a metal supporting layer) of the semiconductor substrate structure 1202 comprises one or more conductive openings 377 corresponding to respective ones of the second bonding pads 352 (ball pad), and the metal bumps 308 are exposed in the conductive openings 377.

Figure 5:
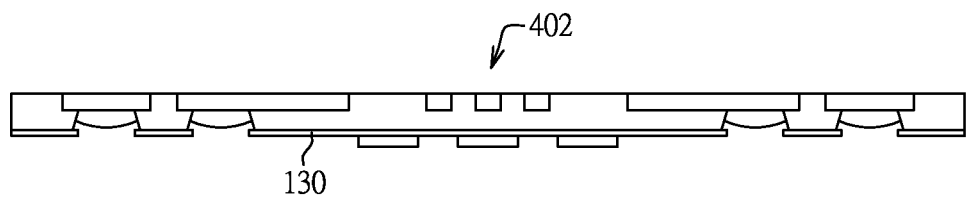
FIG. 5 illustrates a cross-sectional view of a semiconductor substrate structure according to another embodiment of the present disclosure.

FIG. 5 illustrates a cross-sectional view of a semiconductor substrate structure 402 according to another embodiment of the present disclosure. The semiconductor substrate structure 402 of this embodiment is similar to the semiconductor substrate structure 102 illustrated in FIG. 1, except that the conductive post 128 of FIG. 1 is omitted. In one embodiment, the semiconductor substrate structure 402 is used for flip-chip bonding.

Figure 6:
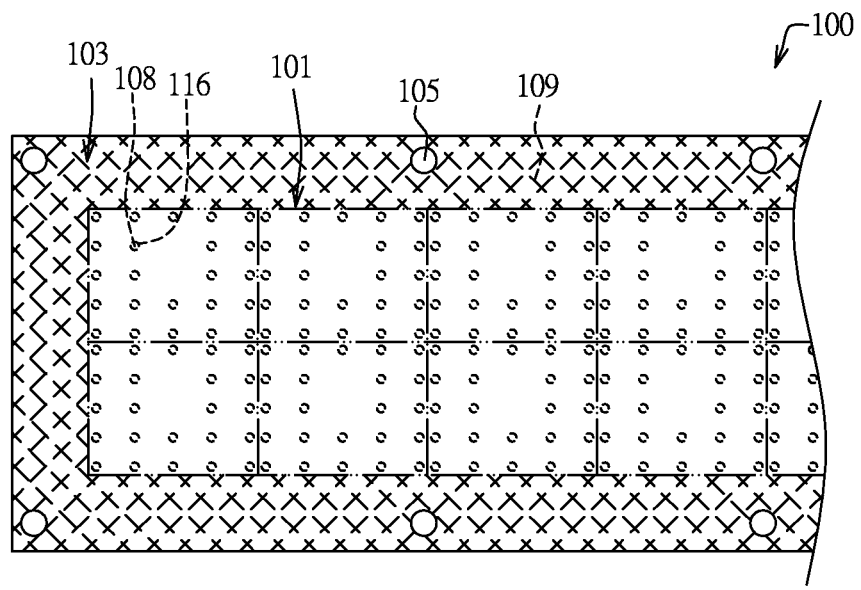
FIG. 6 illustrates a top view of a semiconductor substrate structure according to an embodiment of the present disclosure.

FIG. 6 illustrates a top view of a semiconductor substrate structure 100 according to an embodiment of the present disclosure. The semiconductor substrate structure 100 of this embodiment is a substrate strip, and can be divided into a plurality of unit areas 101 and a side rail 103 surrounding the unit areas 101. It is noted that the unit areas 101 may include one or more of the semiconductor substrate structures of FIG. 1 to FIG. 5. The semiconductor substrate structure 100 comprises a plurality of position holes 105 disposed in the side rail 103 and used by inserting a position pin during packaging.

Figure 7:
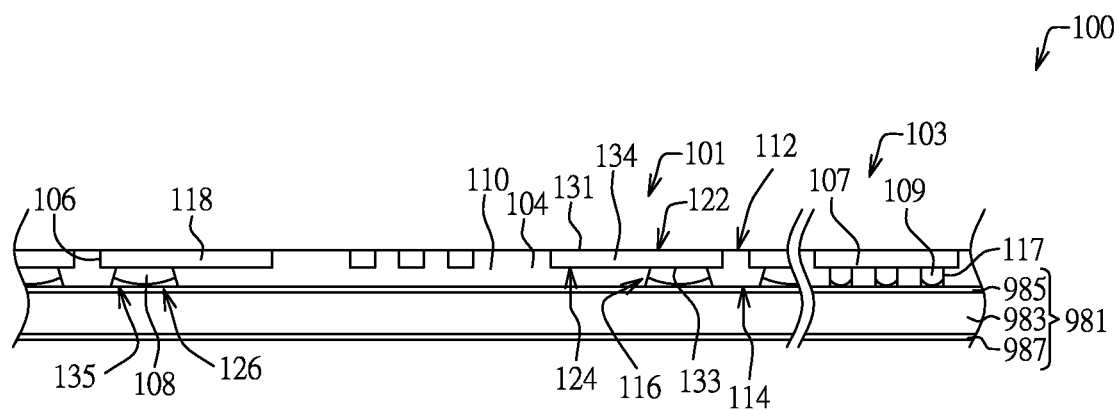
FIG. 7 illustrates a cross-sectional view of the semiconductor substrate structure of FIG. 6.

FIG. 7 illustrates a cross-sectional view of the semiconductor substrate structure 100 of FIG. 6. The semiconductor substrate structure 100 comprises a first structure in a unit area 101 and a second structure in a side rail 103. The first structure in the unit area 101 is similar to the semiconductor substrate structure 402 illustrated in FIG. 5, except that the supporting structure 130 of FIG. 5 is replaced by a second carrier 981, and the thermal pads 132 are omitted. That is, the second carrier 981 of this embodiment is the supporting structure. In one embodiment, the second carrier 981 comprises a core plate 983, a first metal layer 985 and a second metal layer 987, where the core plate 983 includes bismaleimide triazine (BT), and the first metal layer 985 and the second metal layer 987 are copper foils disposed on two sides of the core plate 983; however, the present disclosure is not limited thereto. The dielectric structure 104 is attached or adhered to the first metal layer 985.

In this embodiment, the first structure of the semiconductor substrate structure 100 comprises the dielectric structure 104, the conductive structure 106 and the metal bumps 108. The dielectric structure 104 is the dielectric layer 110, and has the first dielectric surface 112, the second dielectric surface 114 opposite to the first dielectric surface 112, and the dielectric openings 116 on the second dielectric surface 114. The conductive structure 106 is a single-layered metal layer structure, and comprises the first patterned conductive layer 118. The metal bumps 108 are disposed in respective ones of the dielectric openings 116, and are physically and electrically connected to the second conductive surface 124 of the first patterned conductive layer 118; thereby the metal bumps 108 are physically and electrically connected to respective ones of the second bonding pads 133 (ball pad) exposed in the dielectric openings 116.

The second structure comprises the dielectric structure 104, a periphery portion 107 and a reinforcing layer 109. The periphery portion 107 is metal embedded in the dielectric structure 104 and is exposed from the first dielectric surface 112. In this embodiment, the periphery portion 107 is an extension of the first patterned conductive layer 118, that is, they are of the same material and are formed at the same time. The dielectric structure 104 of the second structure is an extension of the dielectric structure 104 of the first structure, that is, they are of the same material and are formed at the same time. The dielectric structure 104 further comprises one or more periphery openings 117 on the second dielectric surface 114 in the side rail 103 to expose a portion of the periphery portion 107. The reinforcing layer 109 is disposed on the periphery portion 107 in the periphery openings 117. In this embodiment, the reinforcing layer 109 and the metal bumps 108 are of the same material and are formed at the same time. In this embodiment, the reinforcing layer 109 is in a mesh pattern as shown in FIG. 6.

In this embodiment, since the semiconductor substrate structure 100 includes the reinforcing layer 109 in the side rail 103, the strength and rigidity of the side rail 103 are enhanced after the second carrier 981 is removed. Therefore, during subsequent processing (such as singulation or marking), the side rail 103 of the semiconductor substrate strip 100 has a reduced risk of cracking or other damage.

Figure 8:
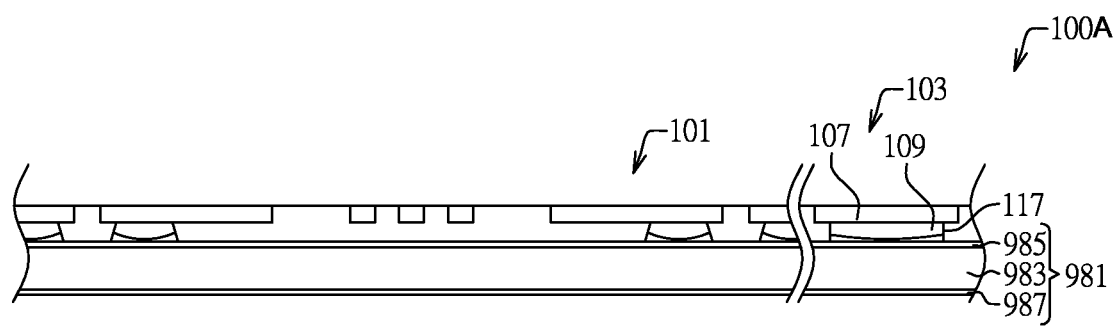
FIG. 8 illustrates a cross-sectional view of a semiconductor substrate structure according to another embodiment of the present disclosure.

FIG. 8 illustrates a cross-sectional view of a semiconductor substrate structure 100A according to another embodiment of the present disclosure. The semiconductor substrate structure 100A of this embodiment is similar to the semiconductor substrate structure 100 illustrated in FIG. 7, except that the reinforcing layer 109 is in a strip pattern with large area.

Figure 9:
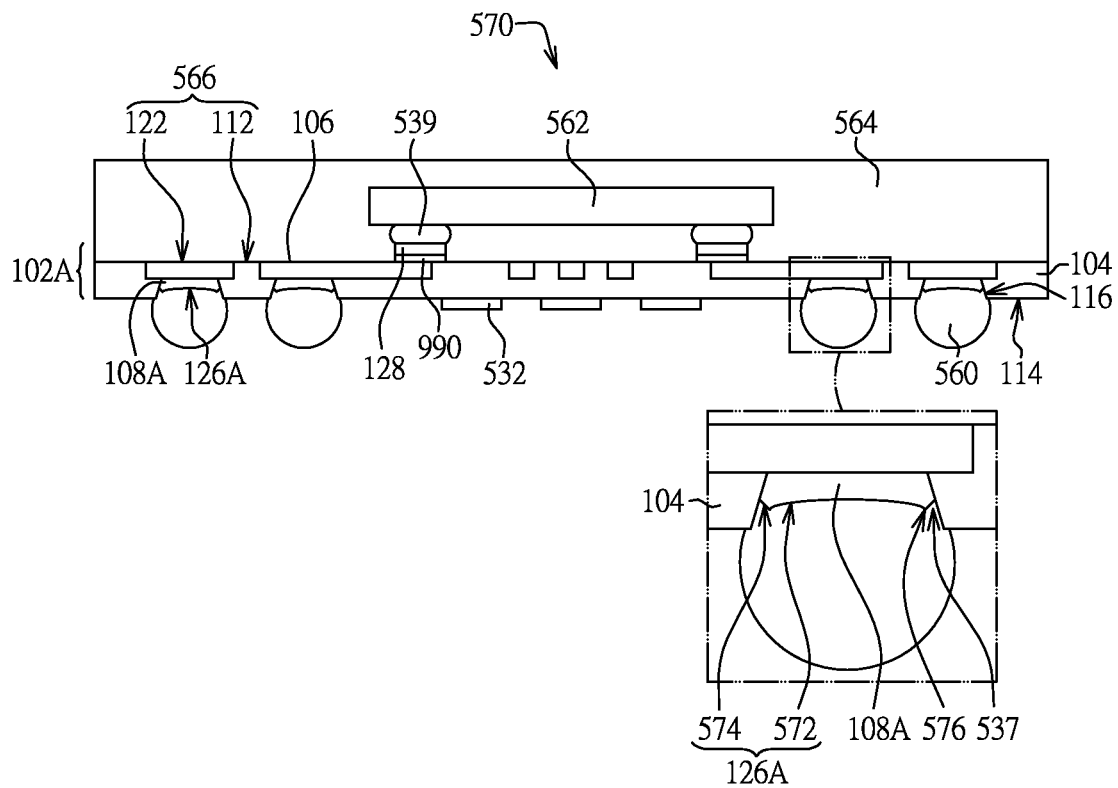
FIG. 9 illustrates a cross-sectional view of a semiconductor package according to an embodiment of the present disclosure.

FIG. 9 illustrates a cross-sectional view of a semiconductor package 570 according to an embodiment of the present disclosure. The semiconductor package 570 comprises a semiconductor substrate structure 102A, one or more solder bumps 560, a semiconductor die 562 and an encapsulant 564. The semiconductor substrate structure 102A of this embodiment is similar to the semiconductor substrate structure 102 illustrated in FIG. 1, except that the supporting structure 130 of FIG. 1 is removed, and the configuration of the bump surface 126 is changed (i.e., to bump surface 126A). Thus, the thermal pads 532 are disposed on the second dielectric surface 114 of the dielectric structure 104 to dissipate the heat generated from the semiconductor die 562 during operation. The metal bump 108A is recessed from the second dielectric surface 114.

In this embodiment, the bump surfaces 126A of the metal bumps 108A of the semiconductor substrate structure 102A includes a concave surface 572 and a side surface 574 adjacent to the concave surface 572. The concave surface 572 and the side surface 574 intersect at a protrusion portion 576, and a gap 537 is formed between the side surface 574 and the dielectric structure 104. Such structure can provide large contact area for a solder bump to be disposed on, and enhance the bonding strength after a solder bump is disposed on a respective metal bump 108A. The formation of the bump surfaces 126A of the metal bumps 108A will be described below.

The solder bumps 560 are disposed in the dielectric openings 116 of the dielectric structure 104, and are physically and electrically connected to respective ones of the bump surfaces 126A of the metal bumps 108A. In addition, the solder bump 560 protrudes from the second dielectric surface 114 of the dielectric structure 104. In this embodiment, the configuration of the bump surfaces 126A can enhance the bonding strength between the solder bumps 560 and the metal bump 108A. It is noted that if the dielectric structure 104 has a high aspect ratio, the solder bumps 560 are difficult to fill in the dielectric openings 116; thus, the solder bumps 560 are not effectively electrically and physically connected to the conductive structure 106 directly. Therefore, the metal bumps 108A on the conductive structure 106 can solve the above-mentioned problem, because the solder bumps 560 can be electrically and physically connected to the conductive structure 106 through the metal bumps 108A.

The semiconductor die 562 is disposed on a first substrate surface 566 (including the first dielectric surface 112 and the first conductive surface 122 that are substantially coplanar with each other) of the semiconductor substrate structure 102A, and is electrically connected to conductive posts 128 by solder 539, so as to electrically connect to the first conductive surface 122 of the conductive structure 106. The encapsulant 564 covers the semiconductor die 562 and a portion of the first substrate surface 566 of the semiconductor substrate structure 102A.

Figure 10:
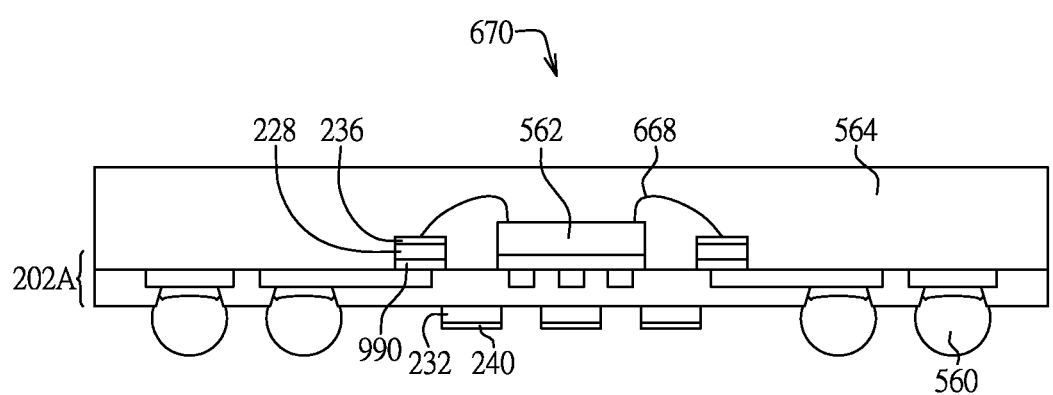
FIG. 10 illustrates a cross-sectional view of a semiconductor package according to another embodiment of the present disclosure.

FIG. 10 illustrates a cross-sectional view of a semiconductor package 670 according to another embodiment of the present disclosure. The semiconductor package 670 of this embodiment is similar to the semiconductor package 570 illustrated in FIG. 9, and the difference is described as follows. The semiconductor package 670 comprises a semiconductor substrate structure 202A, one or more solder bumps 560, a semiconductor die 562 and an encapsulant 564. The semiconductor substrate structure 202A further comprises a surface finish layer 236 and a surface finish layer 240. The surface finish layer 236 is disposed on one or more conductive posts 228, and the surface finish layer 240 is disposed on one or more thermal pads 232. The semiconductor die 562 is electrically connected to the semiconductor substrate structure 202A by bonding wires 668.

Figure 11:
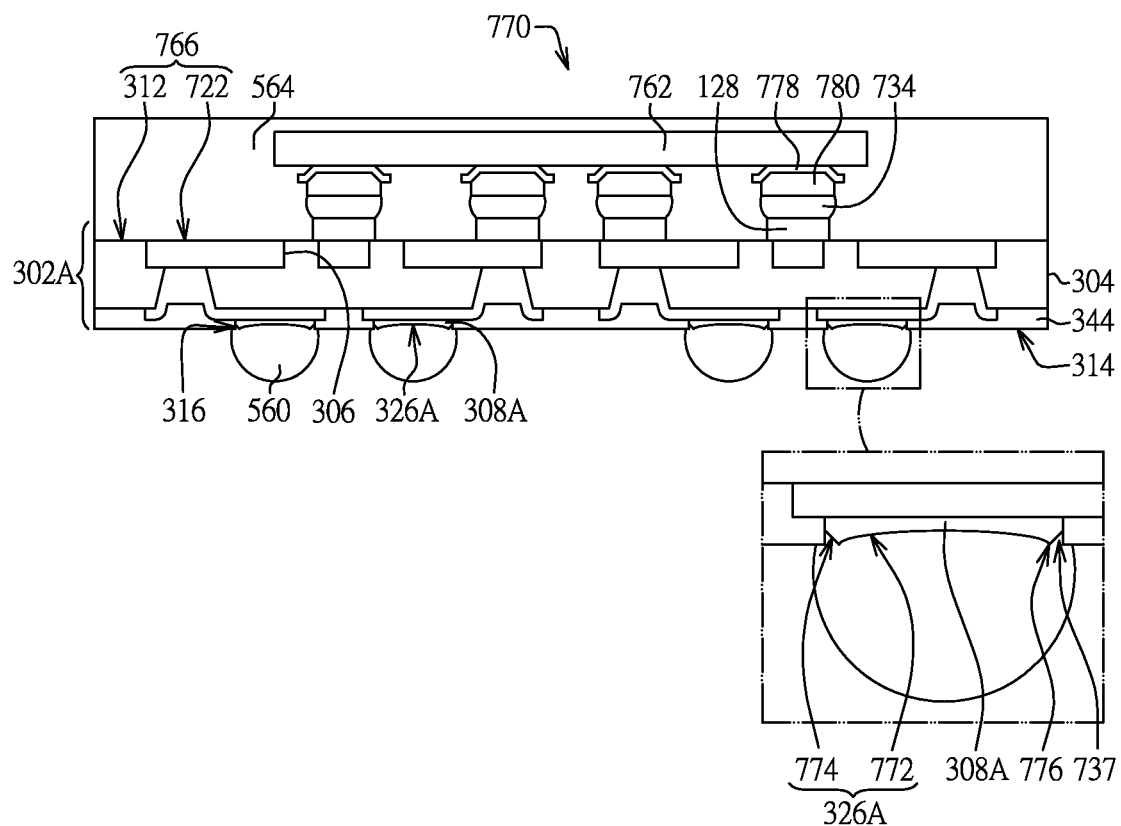
FIG. 11 illustrates a cross-sectional view of a semiconductor package according to another embodiment of the present disclosure.

FIG. 11 illustrates a cross-sectional view of a semiconductor package 770 according to another embodiment of the present disclosure. The semiconductor package 770 comprises a semiconductor substrate structure 302A, one or more solder bumps 560, a semiconductor die 762 and an encapsulant 564. The semiconductor substrate structure 302A of this embodiment is similar to the semiconductor substrate structure 302 illustrated in FIG. 3, and the difference is described as follows. The bump surfaces 326A one or more metal bumps 308A of the semiconductor substrate structure 302A include a concave surface 772 and a side surface 774 adjacent to the concave surface 772. The concave surface 772 and the side surface 774 intersect at a protrusion portion 776, and a gap 737 is formed between the side surface 774 and the dielectric structure 304. Such structure can provide large contact area for a solder bump 560 to be disposed on, and enhance the bonding strength after the solder bumps 560 are disposed on the metal bumps 308A. The formation of the concave surface 772 will be described below.

The solder bumps 560 are disposed in respective ones of the dielectric openings 316 of the second dielectric layer 344 of the dielectric structure 304, and are physically and electrically connected to the bump surfaces 326A of the metal bumps 308A. In addition, the solder bumps 560 protrude from the second dielectric surface 314 of the dielectric structure 304.

In this embodiment, the semiconductor die 762 includes one ore more bonding pads 778 on the active surface thereof and one or more conductive pillars 780 disposed on respective ones of the bonding pads 778. The semiconductor die 762 is electrically and physically connected to the conductive posts 128 of the semiconductor substrate structure 302A through solder 734 on the conductive pillars 780. The encapsulant 564 covers the semiconductor die 762, the conductive pillars 780, the solder 734, the conductive posts 128 and a portion of the first substrate surface 766 (including the first dielectric surface 312 of the dielectric structure 304 and the first conductive surface 722 of the conductive structure 306) of the semiconductor substrate structure 302A. In this embodiment, the conductive pillars 780 and the conductive posts 128 form a sufficiently large space, so that the encapsulant 564 can be fully filled to cover all the elements on the active surface of the semiconductor die 762. Thus, an expensive underfill is unnecessary, thereby reducing manufacturing cost.

FIG. 12A, FIG. 12B, FIG. 12C, FIG. 12D, FIG. 12E, FIG. 12F, FIG. 12G, FIG. 12H, FIG. 12I, FIG. 12J, FIG. 12K, FIG. 12L, FIG. 12M, FIG. 12N, FIG. 12O, FIG. 12P, FIG. 12Q, FIG. 12R, and FIG. 12S illustrate a method of manufacturing a semiconductor package according to an embodiment of the present disclosure.

Figure 12A:
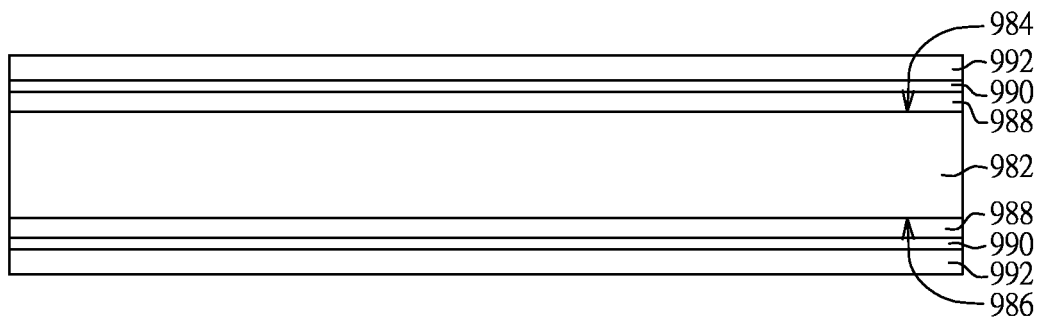
FIG. 12A, FIG. 12B, FIG. 12C, FIG. 12D, FIG. 12E, FIG. 12F, FIG. 12G, FIG. 12H, FIG. 12I, FIG. 12J, FIG. 12K, FIG. 12L, FIG. 12M, FIG. 12N, FIG. 12O, FIG. 12P, FIG. 12Q, FIG. 12R, and FIG. 12S illustrate a method of manufacturing a semiconductor package according to an embodiment of the present disclosure.

Referring to FIG. 12A, a first carrier 982 is provided. The first carrier 982 has a first surface 984 and a second surface 986 opposite to the first surface 984. In one embodiment, the first carrier 982 includes bismaleimide triazine (BT); however, the present disclosure is not limited thereto. A conductive film 988 and a conductive film 990 are disposed on the first surface 984 and the second surface 986. Then, a photoresist layer 992 is disposed on the conductive film 990. In one embodiment, the conductive film 988 is a copper foil with a thickness of about 18 μm, the conductive film 990 is a copper foil with a thickness of about 3 μm, and the photoresist layer 992 is a laminated dry film; however, the present disclosure is not limited thereto.

Figure 12B:
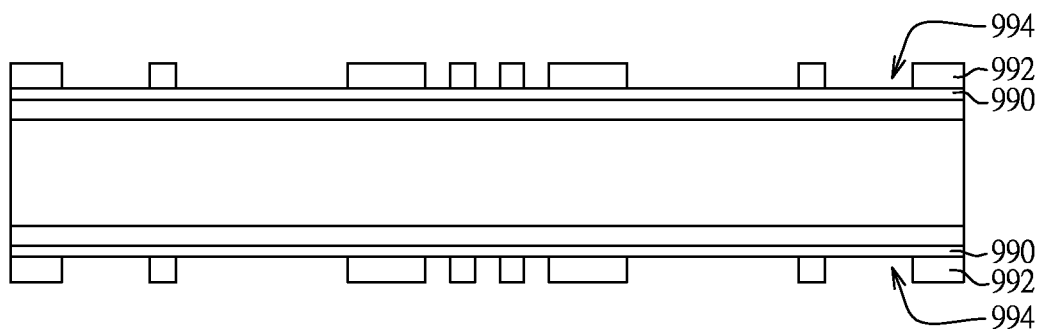

Referring to FIG. 12B, the photoresist layer 992 is patterned. The patterning method may include exposure and development, so as to define a pattern opening 994 in the photoresist layer 992 and expose the conductive film 990.

Figure 12C:
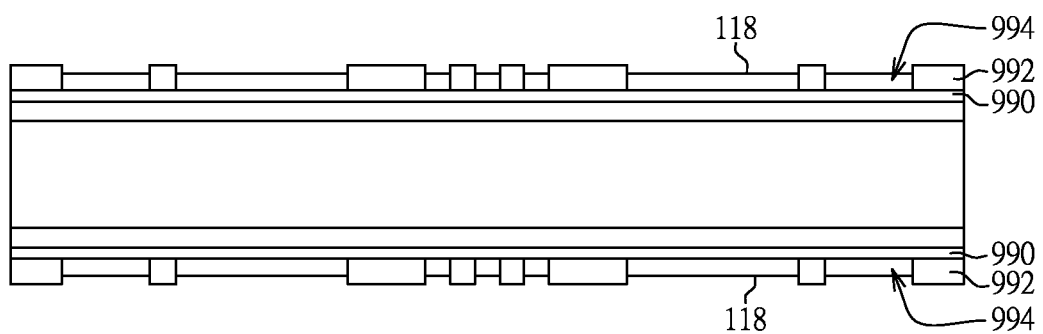

Referring to FIG. 12C, a first patterned conductive layer 118 is formed on the conductive film 990 exposed from the pattern opening 994 of the photoresist layer 992. In one embodiment, the first patterned conductive layer 118 is formed by plating. The thickness of the first patterned conductive layer 118 is about 20 μm, and the material of the first patterned conductive layer 118 is copper; however, the present disclosure is not limited thereto. In this embodiment, the first conductive traces 134 (FIG. 1) of the first patterned conductive layer 118 may be made to be fine pitch (e.g., less than or equal to 15 μm).

Figure 12D:
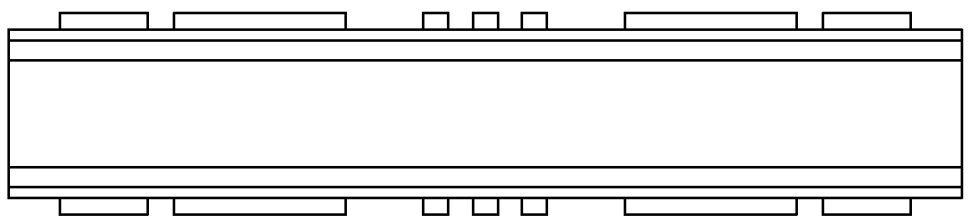

Referring to FIG. 12D, the photoresist layer 992 as shown in FIG. 12C is removed.

Figure 12E:
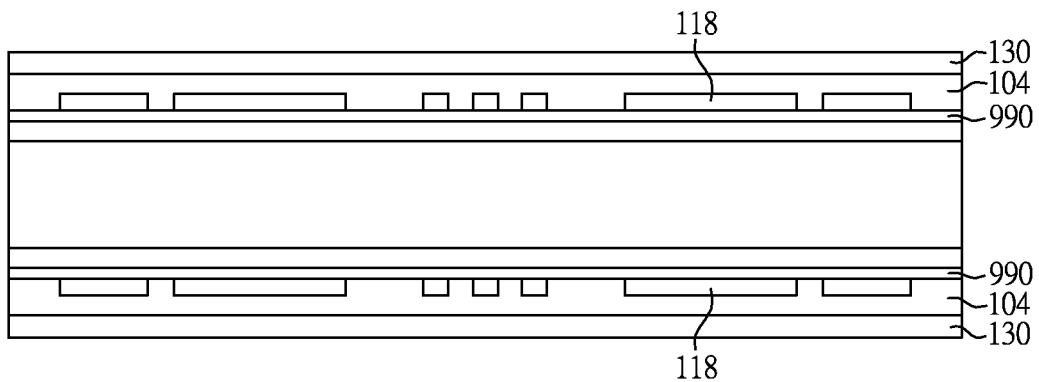

Referring to FIG. 12E, the dielectric structure 104 is disposed on the conductive film 990 and the first patterned conductive layer 118. Then, the supporting structure 130 is disposed on the dielectric structure 104. In one embodiment, the supporting structure 130 is a metal supporting layer of copper foil with a thickness of about 12 μm, and the material of the dielectric structure 104 may be prepreg, Ajinomoto build-up film (ABF), solder resist layer, liquid crystal polymer (LCP), polyimide (PI) and photo-sensitive resin; however, the present disclosure is not limited thereto.

Figure 12F:
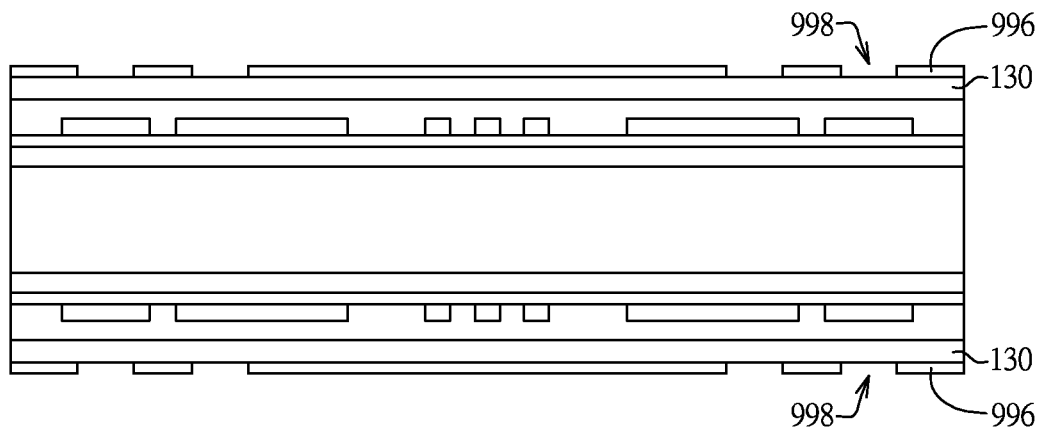

Referring to FIG. 12F, a patterned photoresist layer 996 is disposed on the supporting structure 130. The patterning method may include exposing and developing the photoresist layer 996. The patterned photoresist layer 996 has one or more openings 998 to expose the supporting structure 130. In one embodiment, the photoresist layer 996 is a dry film; however, the present disclosure is not limited thereto.

Figure 12G:
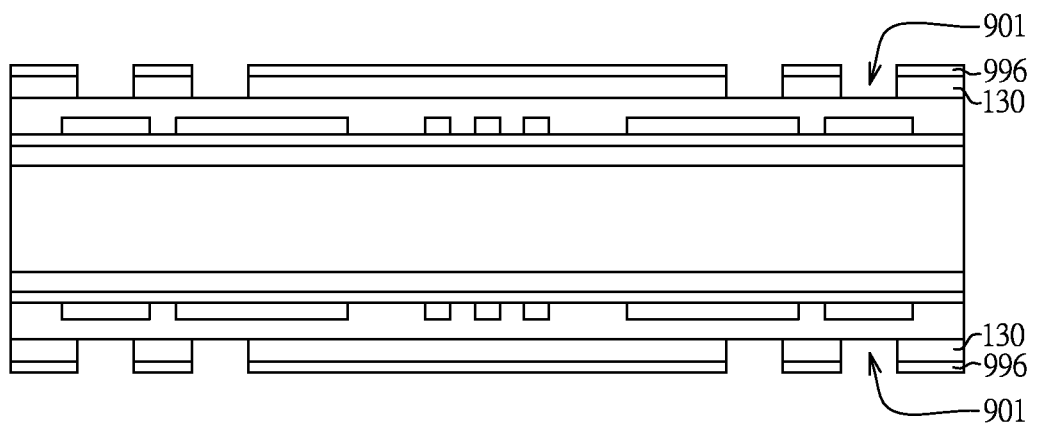

Referring to FIG. 12G, etching is performed by using the photoresist layer 996 as an etching mask, to extend the openings 998 of FIG. 12F down to the supporting structure 130 to form one or more openings 901.

Figure 12H:
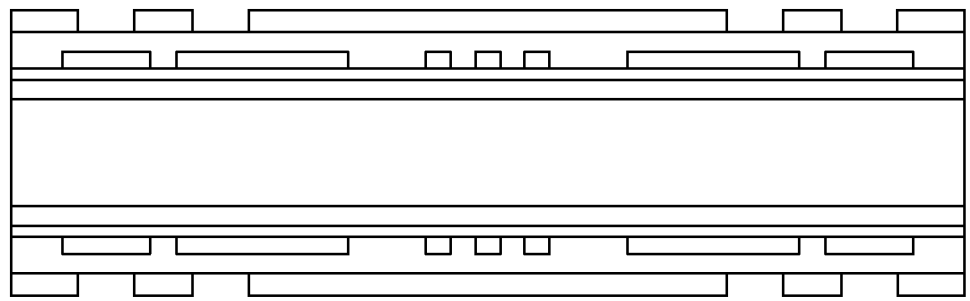

Referring to FIG. 12H, the photoresist layer 996 in FIG. 12G is removed.

Figure 12I:
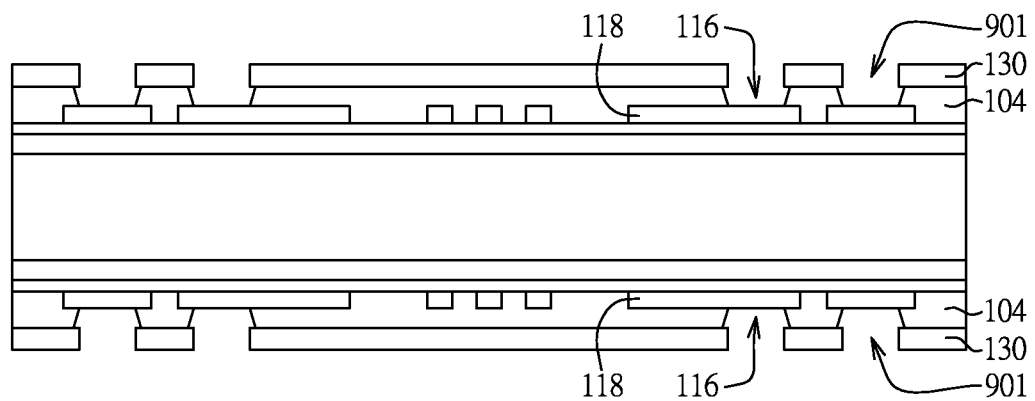

Referring to FIG. 12I, a portion of the dielectric structure 104 that is exposed by the openings 901 of the supporting structure 130 is removed, so that the dielectric openings 116 are formed in the dielectric structure 104 to expose the first patterned conductive layer 118. The dielectric structure 104 may be removed by laser or etching.

Figure 12J:
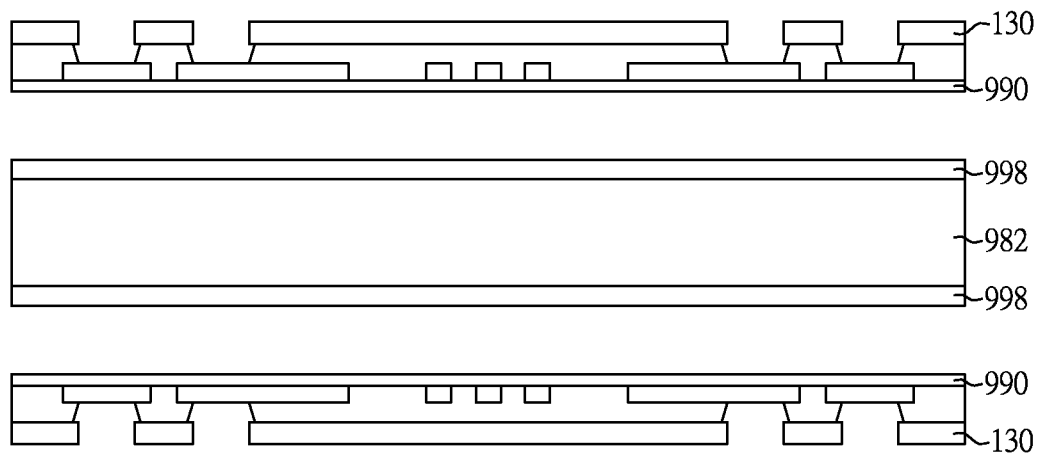

Referring to FIG. 12J, the conductive film 990 is separated from the conductive film 988, so that the upper substrate structure and the lower substrate structure are separated from the first carrier 982. Meanwhile, the supporting structure 130 can reinforce the strength and rigidity of the upper substrate structure and the lower substrate structure, so that warpage will be reduced.

Figure 12K:
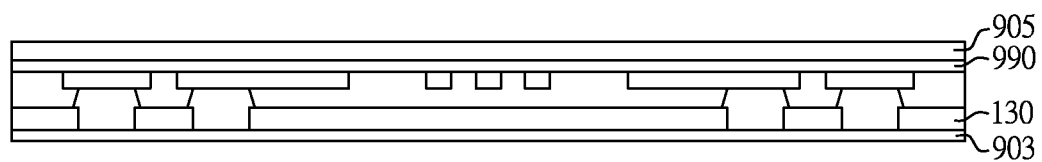

Referring to FIG. 12K, a photoresist layer 903 is disposed on the supporting structure 130, and a photoresist layer 905 is disposed on the conductive film 990. In one embodiment, the photoresist layer 903 and photoresist layer 905 are laminated dry films; however, the present disclosure is not limited thereto.

Figure 12L:
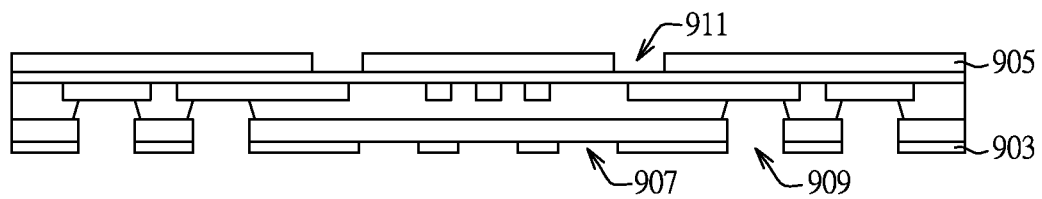

Referring to FIG. 12L, the photoresist layer 903 is patterned to define one or more openings 907 and one or more openings 909 in the photoresist layer 903. The photoresist layer 905 is patterned to define one or more openings 911 in the photoresist layer 905.

Figure 12M:
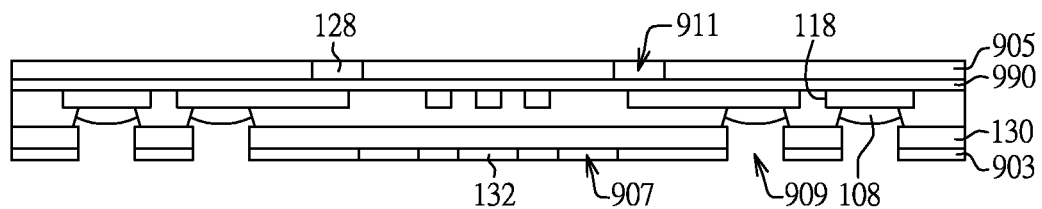

Referring to FIG. 12M, the metal bumps 108 are formed on the first patterned conductive layer 118 exposed by the openings 909 of the photoresist layer 903 by, for example, plating. The thermal pads 132 are formed on the supporting structure 130 exposed by the openings 907 of the photoresist layer 903 and the conductive posts 128 are formed on the conductive film 990 exposed by the openings 911 of the photoresist layer 905. In one embodiment, the metal bumps 108, the thermal pads 132 and the conductive posts 128 include copper material with a thickness of about 18 μm; however, the present disclosure is not limited thereto.

Figure 12N:
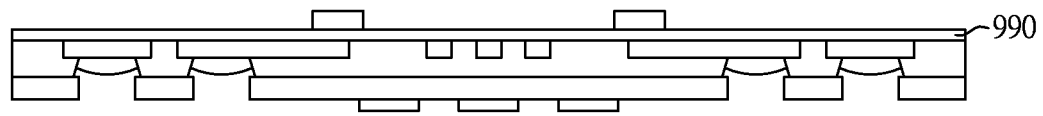

Referring to FIG. 12N, the photoresist layer 903 and the photoresist layer 905 as shown FIG. 12M are removed.

Figure 12O:
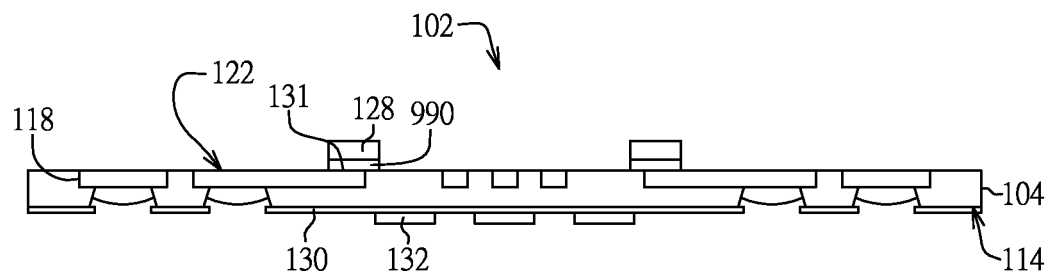

Referring to FIG. 12O, the conductive film 990 as shown in FIG. 12N may be removed. In one embodiment, the conductive film 990 is removed by flash etching. The portion of the conductive film 990 that is covered by the conductive posts 128 will not be etched, and may become part of the conductive post 128. The thickness of the supporting structure 130 is reduced. Similarly, the portion of the supporting structure 130 that is covered by the thermal pads 132 will not be etched, and may become part of the thermal pads 132. After this point, the semiconductor substrate structure 102 is obtained. It is noted that the above process may not include the formation of the conductive posts 128.

Figure 12P:
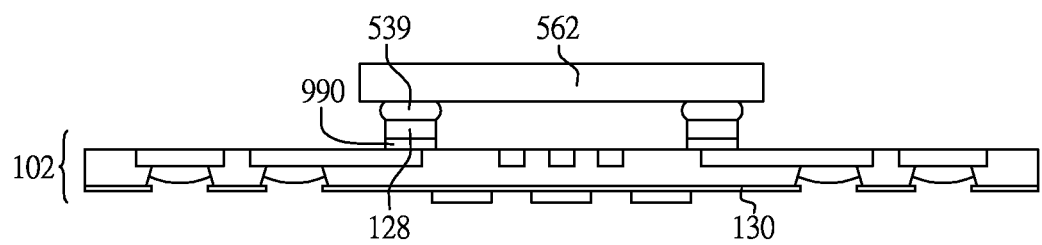

Referring to FIG. 12P, since the semiconductor substrate structure 102 includes the supporting structure 130, its strength and rigidity are enhanced during subsequent packaging, which can improve yield. Meanwhile, the semiconductor die 562 is electrically connected to the conductive posts 128 by the solder 539.

Figure 12Q:
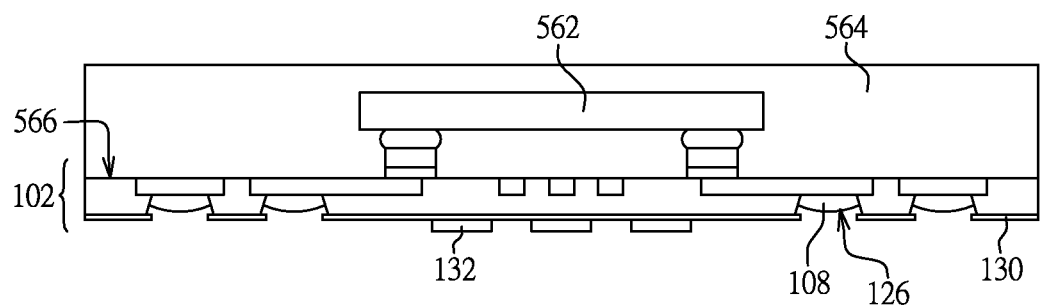

Referring to FIG. 12Q, the encapsulant 564 is applied to cover the semiconductor die 562 and the first substrate surface 566 of the semiconductor substrate structure 102.

Figure 12R:
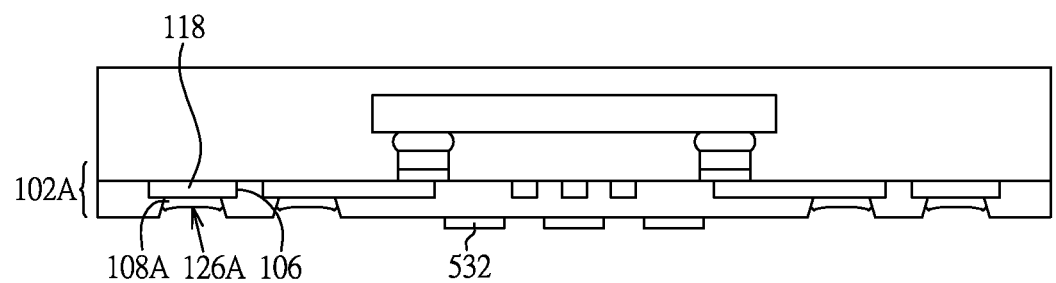

Referring to FIG. 12R, after the completion of the flip-chip bonding and molding processes, the supporting structure 130 as shown in FIG. 12Q is then removed. In one embodiment, the supporting structure 130 is a metal supporting layer removed by flash etching. Meanwhile, the metal bumps 108 (FIG. 12Q) will be simultaneously etched, so that the bump surfaces 126 as an original convex curved surface will be partially etched to form the bump surfaces 126A, to form the metal bumps 108A. The configuration of the bump surfaces 126A is described with respect to FIG. 9. The metal bumps 108A can protect the first patterned conductive layer 118 from being etched, thus, the thickness of the conductive structure 106 is maintained. During flash etching, the thermal pads 132 are extended to the supporting structure 130 to form the thermal pads 532. After this point, the semiconductor substrate structure 102 becomes the semiconductor substrate structure 102A.

Figure 12S:
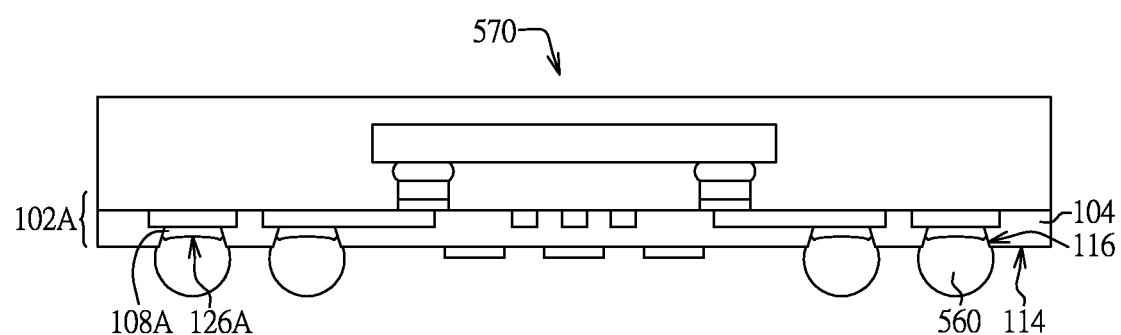

Referring to FIG. 12S, the solder bumps 560 are disposed in the dielectric openings 116 of the dielectric structure 104, and are physically and electrically connected to respective ones of the bump surfaces 126A of the metal bumps 108A. In addition, the solder bumps 560 protrude from the second dielectric surface 114 of the dielectric structure 104. In this embodiment, the configuration of the metal bumps 108A can enhance the bonding strength between the solder bumps 560 and the metal bumps 108A. After this point, the semiconductor package 570 is obtained.

FIG. 13A, FIG. 13B, FIG. 13C, FIG. 13D, FIG. 13E, FIG. 13F, FIG. 13G, FIG. 13H, FIG. 13I, FIG. 13J, FIG. 13K, and FIG. 13L illustrate a method of manufacturing a semiconductor package according to another embodiment of the present disclosure.

Figure 13A:
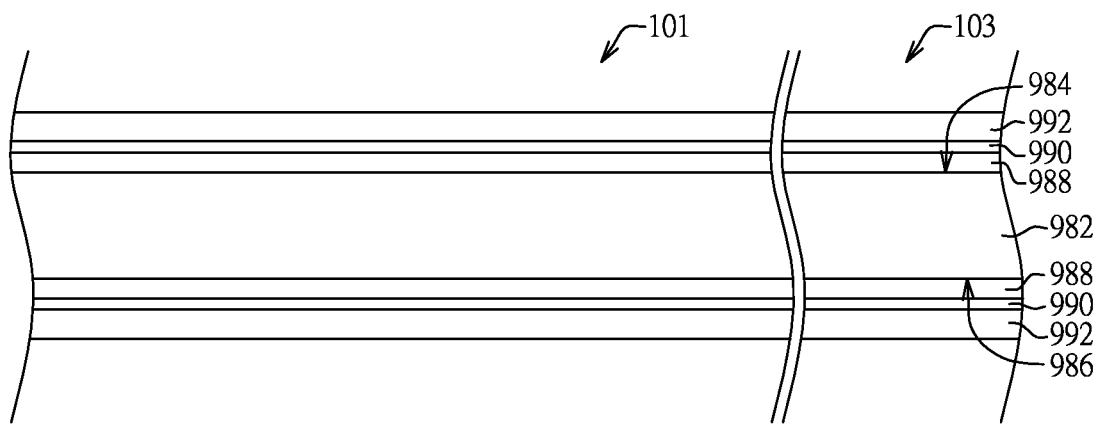
FIG. 13A, FIG. 13B, FIG. 13C, FIG. 13D, FIG. 13E, FIG. 13F, FIG. 13G, FIG. 13H, FIG. 13I, FIG. 13J, FIG. 13K, and FIG. 13L illustrate a method of manufacturing a semiconductor package according to another embodiment of the present disclosure.

Referring to FIG. 13A, a first carrier 982 is provided. The first carrier 982 has a first surface 984 and a second surface 986 opposite to the first surface 984. A conductive film 988 and a conductive film 990 are disposed on the first surface 984 and the second surface 986. Then, a photoresist layer 992 is disposed on the conductive film 990. In this embodiment, the first carrier 982 may be divided into a plurality of unit areas 101 and a side rail 103 surrounding the unit areas 101.

Figure 13B:
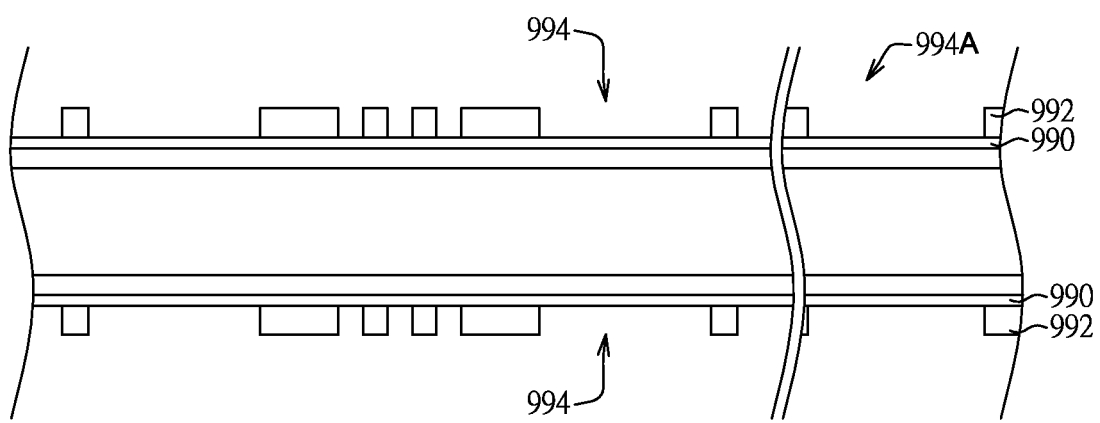

Referring to FIG. 13B, the photoresist layer 992 is patterned to define one or more pattern openings 994 in the unit areas 101 and one or more pattern openings 994A in the side rail 103 to expose the conductive film 990.

Figure 13C:
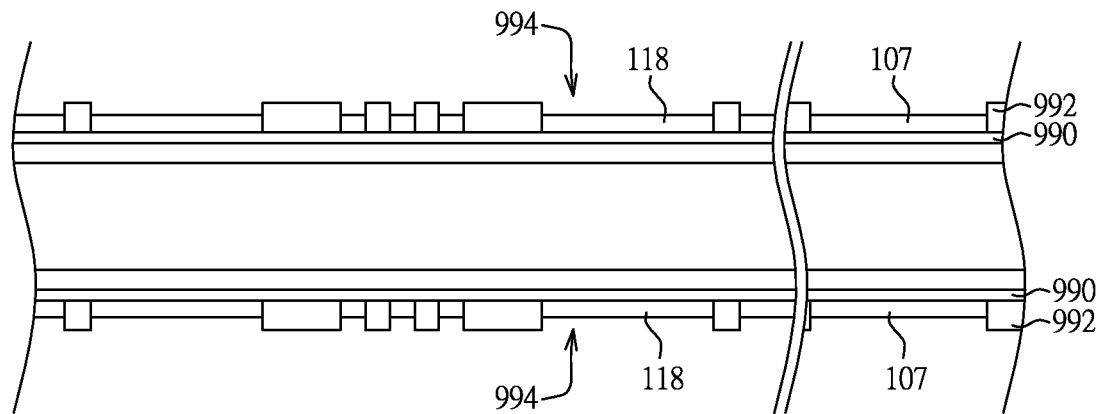

Referring to FIG. 13C, the first patterned conductive layer 118 is formed on the conductive film 990 exposed from the pattern openings 994 of the photoresist layer 992, and a periphery portions 107 are formed on the conductive film 990 exposed from the pattern openings 994A of the photoresist layer 992. In this embodiment, the periphery portions 107 are an extension of the first patterned conductive layer 118, that is, they are of the same material and are formed (e.g., plated) at the same time. A thickness of the first patterned conductive layer 118 and the periphery portions 107 is about 20 μm, and the material of the first patterned conductive layer 118 and the periphery portions 107 is copper; however, the present disclosure is not limited thereto. In this embodiment, the first conductive traces 134 (FIG. 1) of the first patterned conductive layer 118 may be made to be fine pitch (e.g., about 15 μm).

Figure 13D:
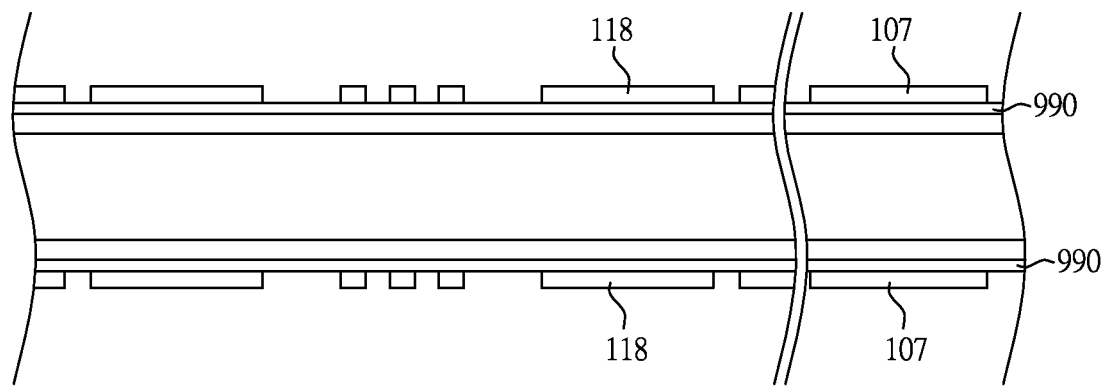

Referring to FIG. 13D, the photoresist layer 992 as shown in FIG. 13C is removed.

Figure 13E:
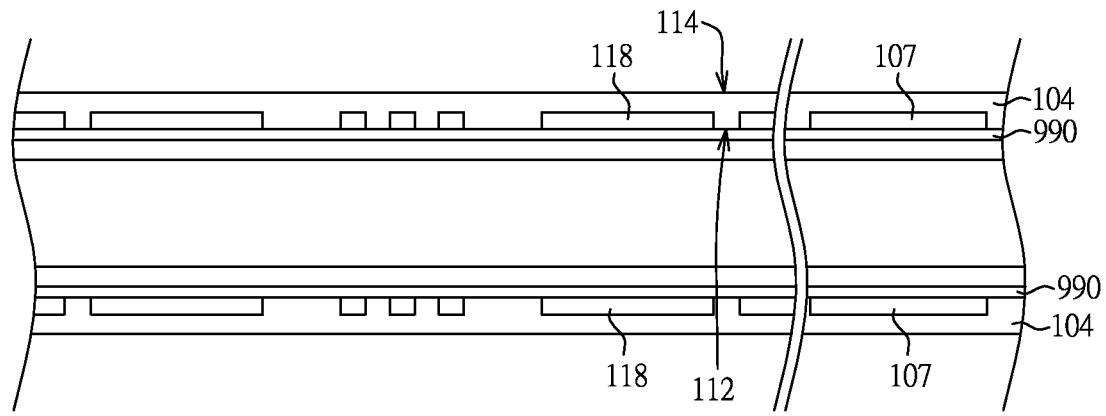

Referring to FIG. 13E, a dielectric structure 104 is disposed on the conductive film 990, the first patterned conductive layer 118 and the periphery portions 107. In this embodiment, the dielectric structure 104 is a dielectric structure with the material being a photo-sensitive resin in B-stage. The dielectric structure 104 has a first dielectric surface 112 and a second dielectric surface 114

Figure 13F:
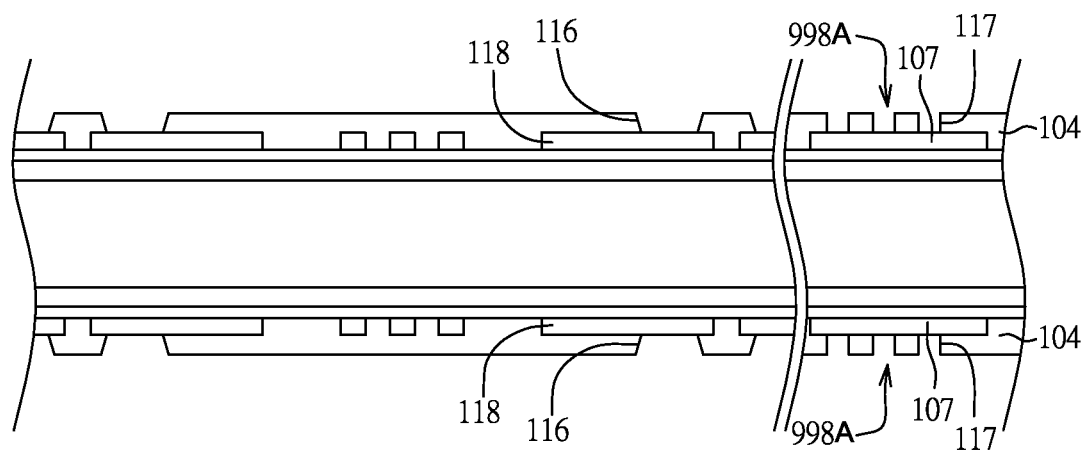

Referring to FIG. 13F, the dielectric structure 104 is patterned. The patterning may include exposure and development. The patterned dielectric structure 104 has one or more dielectric openings 116 to expose a portion of the first patterned conductive layer 118 and one or more periphery openings 117 to expose a portion of the periphery portions 107.

Figure 13G:
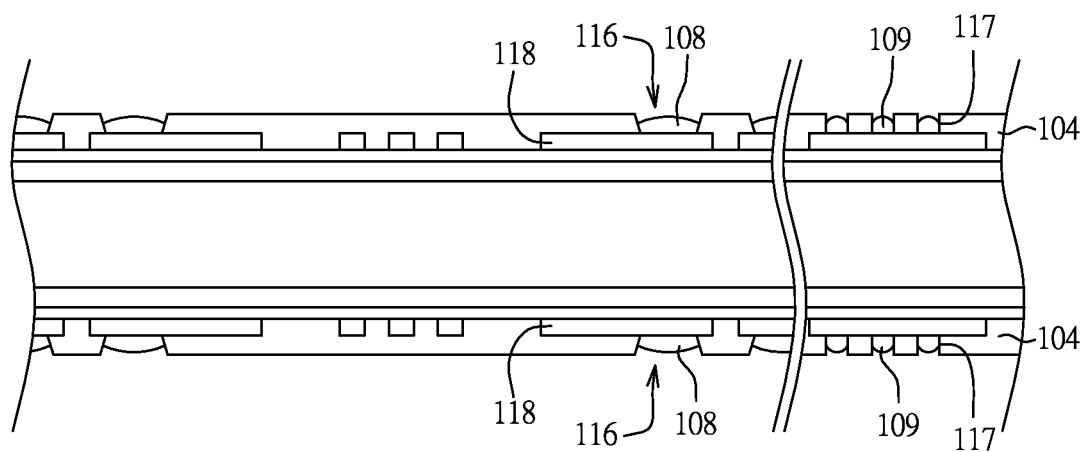

Referring to FIG. 13G, one or more metal bumps 108 are formed on the first patterned conductive layer 118 exposed by the dielectric opening 116 by, for example, plating, and a reinforcing layer 109 is formed on the periphery portions 107 exposed by the periphery openings 117. In this embodiment, the reinforcing layer 109 and the metal bumps 108 are of the same material and are formed at the same time. In this embodiment, the reinforcing layer 109 is in a mesh pattern as shown in FIG. 6.

Figure 13H:
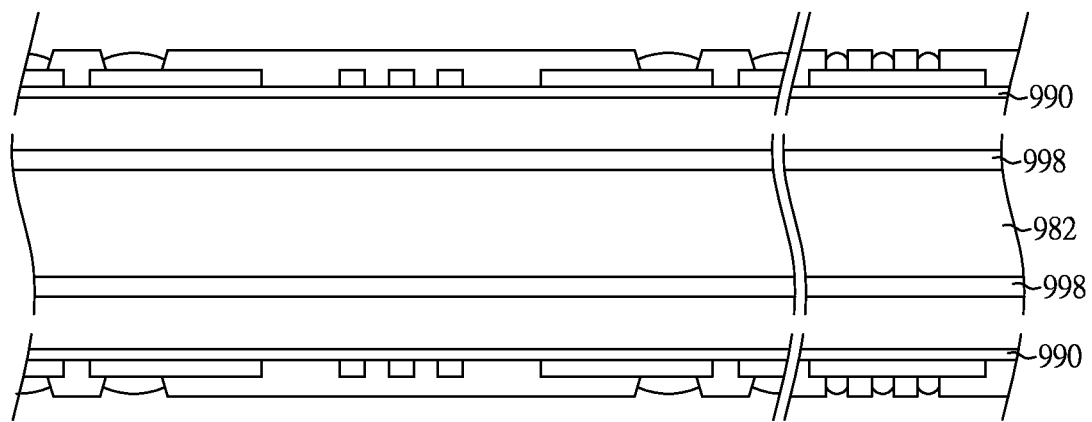

Referring to FIG. 13H, the conductive film 990 is separated from the conductive film 988, so that the upper substrate structure and the lower substrate structure are separated from the first carrier 982.

Figure 13I:
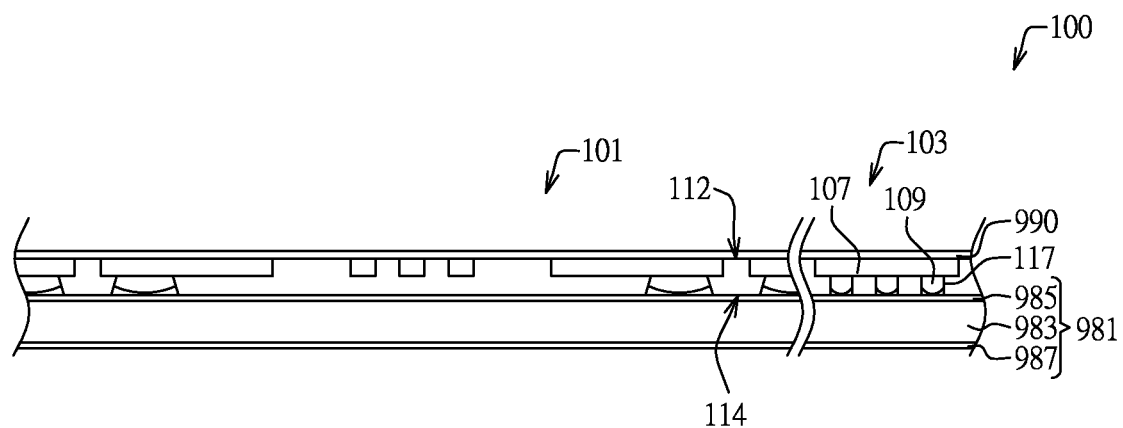

Referring to FIG. 13I, a supporting structure is formed on the second dielectric surface 114. In this embodiment, the supporting structure is the second carrier 981 that comprises a core plate 983, a first metal layer 985 and a second metal layer 987. In one embodiment, the core plate 983 includes bismaleimide triazine (BT), and the first metal layer 985 and the second metal layer 987 are copper foils disposed on two sides of the core plate 983. The second dielectric surface 114 of the dielectric structure 104 is attached or adhered to the first metal layer 985.

It is noted that the second carrier 981 may be attached to the second dielectric surface 114 of the dielectric structure 104 of FIG. 13G first, and then the conductive film 990 may be removed from the conductive film 988, for example, by etching, so that the semiconductor substrate structure 100 (semiconductor substrate strip) as shown in FIG. 7 is obtained.

Figure 13J:
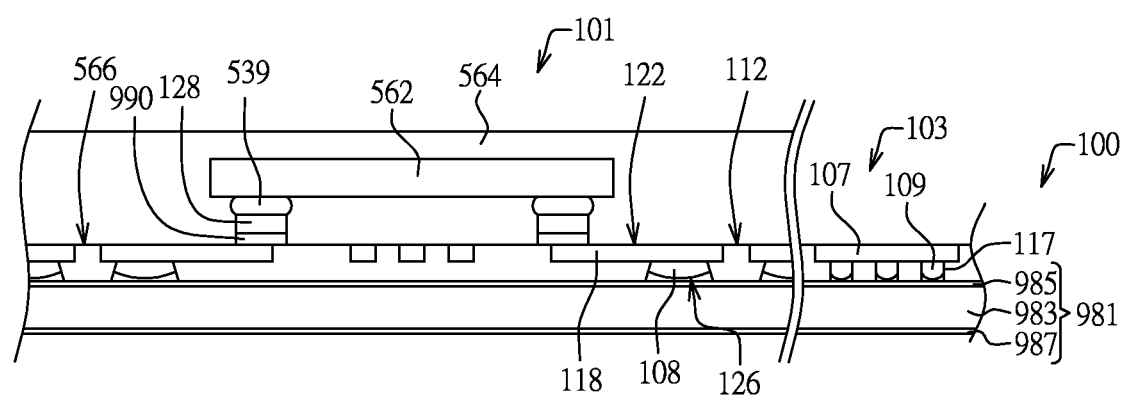

Referring to FIG. 13J, in the unit areas 101, one or more conductive posts 128 are formed on the first patterned conductive layer 118, and then, the semiconductor die 562 is electrically connected to the conductive posts 128 by the solder 539. Then, the encapsulant 564 is applied to cover the semiconductor die 562 and the first substrate surface 566 (including the first dielectric surface 112 and the first conductive surface 122 that are substantially coplanar with each other) of the semiconductor substrate structure 100.

Figure 13K:
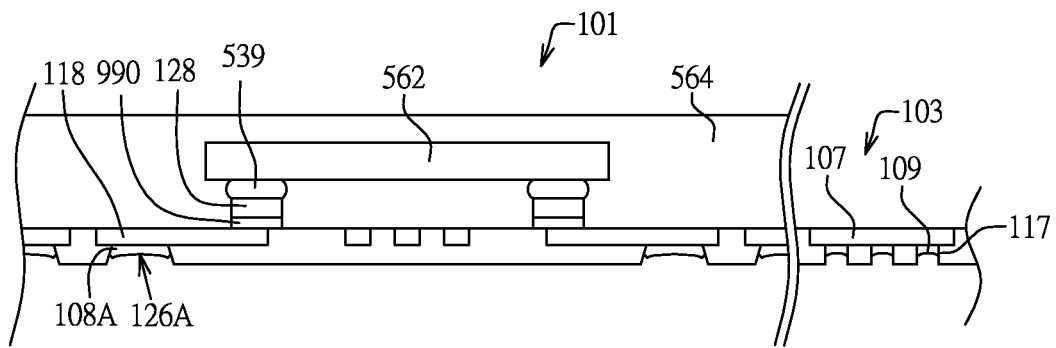

Referring to FIG. 13K, after the completion of flip-chip bonding and molding, the second carrier 981 as shown in FIG. 13J is then removed. In one embodiment, the first metal layer 985 is removed from the core plate 983, and then, the first metal layer 985 is removed by flash etching. Meanwhile, the metal bumps 108 (FIG. 13J) will be simultaneously etched, so that the bump surfaces 126 (originally convex curved surfaces) will be partially etched to form the bump surfaces 126A, so as to form the metal bumps 108A. The metal bumps 108A can protect the first patterned conductive layer 118 from being etched, thus, the thickness of the first patterned conductive layer 118 is maintained. During flash etching, the reinforcing layer 109 is also etched.

Figure 13L:
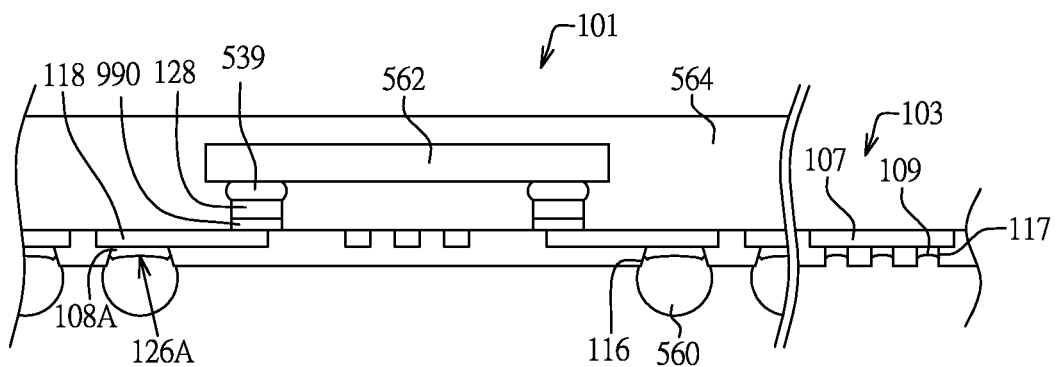

Referring to FIG. 13L, one or more solder bumps 560 are disposed in the dielectric openings 116 of the dielectric structure 104, and are physically and electrically connected to the bump surfaces 126A of the metal bumps 108A. In addition, the solder bumps 560 protrude from the second dielectric surface 114 of the dielectric structure 104. In this embodiment, the configuration of the metal bumps 108A can enhance the bonding strength between the solder bumps 560 and the metal bumps 108A. In addition, since the semiconductor substrate structure 100 includes the reinforcing layer 109 in the side rail 103, the strength and rigidity of the side rail 103 are enhanced after the second carrier 981 is removed, and therefore the side rail 103 of the semiconductor substrate strip 100 has low risk of cracking or other damage. Then, singulation is conducted to separate the side rail 103 from the unit areas 101. After the singulation, the semiconductor package 570 (FIG. 9) is obtained. It is noted that, during the singulation process, the side rail 103 of the semiconductor substrate strip 100 is not warped so that the position pin may be easily inserted into the position holes in the side rail.

FIG. 14A, FIG. 14B, FIG. 14C, FIG. 14D, FIG. 14E, FIG. 14F, and FIG. 14G illustrate a method of manufacturing a semiconductor package according to another embodiment of the present disclosure. The initial steps of this embodiment are same as FIG. 12A to FIG. 12L, and the following steps are subsequent to FIG. 12L.

Figure 14A:
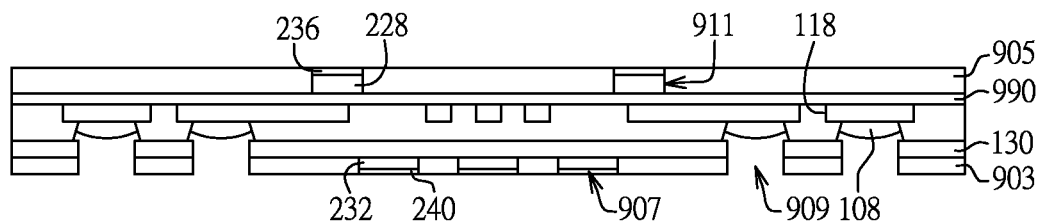
FIG. 14A, FIG. 14B, FIG. 14C, FIG. 14D, FIG. 14E, FIG. 14F, and FIG. 14G illustrate a method of manufacturing a semiconductor package according to another embodiment of the present disclosure.

Referring to FIG. 14A, one or more metal bumps 108 are formed on the first patterned conductive layer 118 exposed by the openings 909 of the photoresist layer 903 by, for example, plating; one or more thermal pads 232 and the surface finish layer 240 are formed on the supporting structure 130 exposed by the openings 907 of the photoresist layer 903, and one or more conductive posts 228 and the surface finish layer 236 are formed on the conductive film 990 exposed by the openings 911 of the photoresist layer 905. In one embodiment, the metal bumps 108, the thermal pads 132 and the conductive posts 128 include copper material with a thickness of about 18 μm, and the material of the surface finish layer 236 and the surface finish layer 240 includes gold, silver, or nickel or combinations thereof; however, the present disclosure is not limited thereto.

Figure 14B:
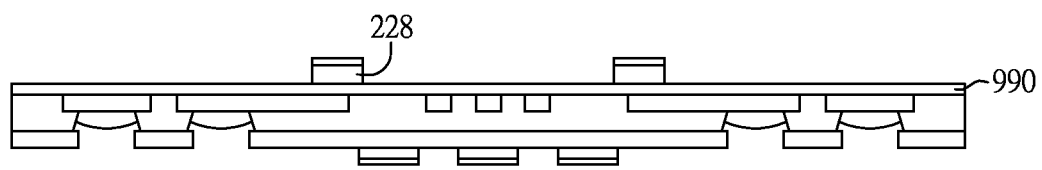

Referring to FIG. 14B, the photoresist layer 903 and the photoresist layer 905 as shown FIG. 14A are removed.

Figure 14C:
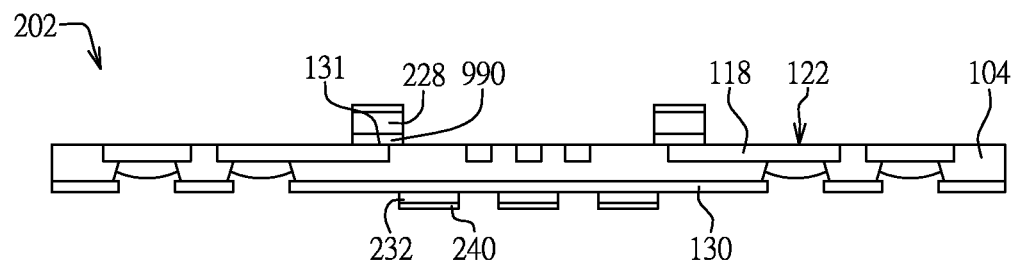

Referring to FIG. 14C, the conductive film 990 as shown in FIG. 14B may be removed. In one embodiment, the conductive film 990 is removed by flash etching. The portion of the conductive film 990 that is covered by the conductive posts 228 will not be etched, and may become part of the conductive posts 228. The thickness of the supporting structure 130 is thereby reduced. Similarly, the portion of the supporting structure 130 that is covered by the thermal pads 232 will not be etched, and may become part of the thermal pads 232. After this point, the semiconductor substrate structure 202 is obtained.

Figure 14D:
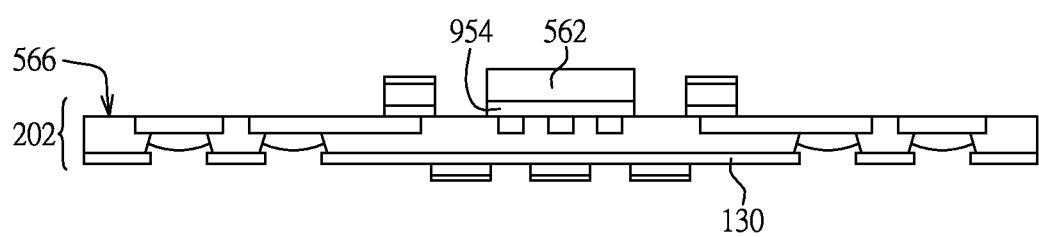

Referring to FIG. 14D, since the semiconductor substrate structure 202 includes the supporting structure 130, its strength and rigidity are enhanced during subsequent packaging, which can improve yield. Meanwhile, the semiconductor die 562 is attached to the first substrate surface 566 of the semiconductor substrate structure 202 by an adhesive layer 954.

Figure 14E:
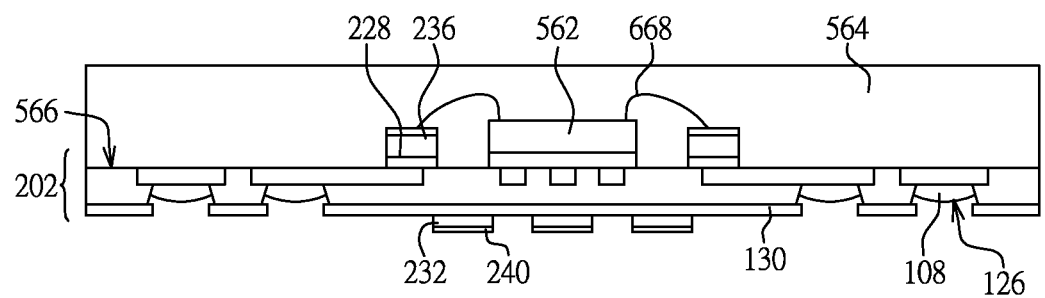

Referring to FIG. 14E, the semiconductor die 562 is electrically connected to the surface finish layer 236 on the conductive post 228 by the bonding wires 668. Then, the encapsulant 564 is applied to cover the semiconductor die 562, the bonding wires 668 and the first substrate surface 566 of the semiconductor substrate structure 202.

Figure 14F:
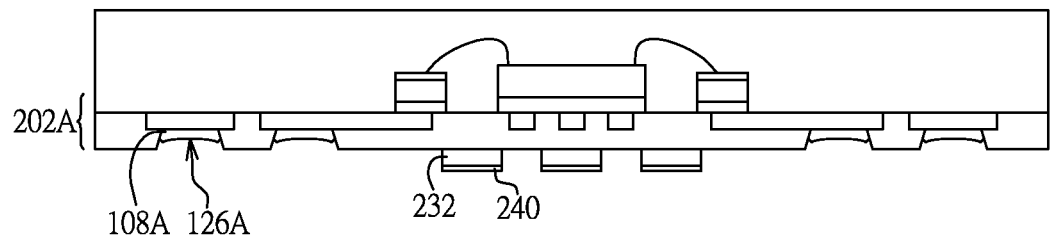

Referring to FIG. 14F, after wire bonding and molding, the supporting structure 130 as shown in FIG. 14E is removed. In one embodiment, the supporting structure 130 is a metal supporting layer removed by flash etching. Meanwhile, the metal bumps 108 will be simultaneously etched, so that the bump surfaces 126 (FIG. 14E) (originally convex curved surfaces) will be partially etched to form the bump surfaces 126A, so as to form the metal bumps 108A. During this flash etching, the thermal pads 232 are extended to the supporting structure 130. After this point, the semiconductor substrate structure 202 (FIG. 14E) becomes the semiconductor substrate structure 202A.

Figure 14G:
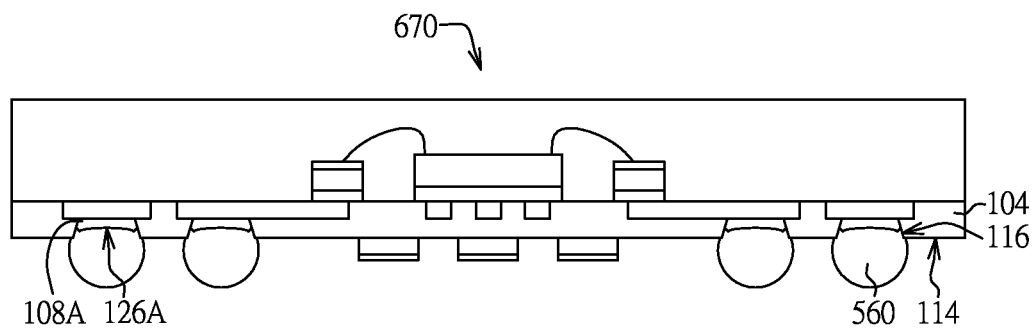

Referring to FIG. 14G, the solder bumps 560 are disposed in the dielectric openings 116 of the dielectric structure 104, and are physically and electrically connected to the bump surfaces 126A of the metal bumps 108A. In addition, the solder bumps 560 protrude from the second dielectric surface 114 of the dielectric structure 104. In this embodiment, the configuration of the metal bumps 108A can enhance the bonding strength between the solder bumps 560 and the metal bumps 108A. After this point, the semiconductor package 670 is obtained.

FIG. 15A, FIG. 15B, FIG. 15C, FIG. 15D, FIG. 15E, FIG. 15F, FIG. 15G, FIG. 15H, FIG. 15I, FIG. 15J, FIG. 15K, FIG. 15L and FIG. 15M illustrate a method of manufacturing a semiconductor package according to another embodiment of the present disclosure.

Figure 15A:
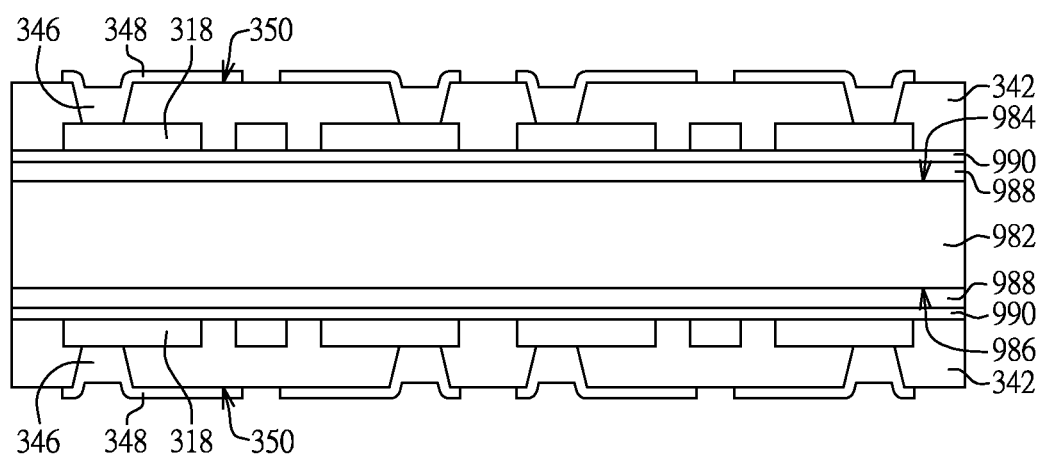
FIG. 15A, FIG. 15B, FIG. 15C, FIG. 15D, FIG. 15E, FIG. 15F, FIG. 15G, FIG. 15H, FIG. 15I, FIG. 15J, FIG. 15K, FIG. 15L and FIG. 15M illustrate a method of manufacturing a semiconductor package according to another embodiment of the present disclosure.

Referring to FIG. 15A, a first carrier 982 is provided. The first carrier 982 has a first surface 984 and a second surface 986 opposite to the first surface 984. A conductive film 988 and a conductive film 990 are disposed on the first surface 984 and the second surface 986. Then, a first dielectric layer 342 is disposed on the conductive film 990, and a first patterned conductive layer 318 is embedded in the first dielectric layer 342. One or more conductive vias 346 extend through the first dielectric layer 342 and electrically connects the first patterned conductive layer 318 and the second patterned conductive layer 348 on a third dielectric surface 350 of the first dielectric layer 342.

Figure 15B:
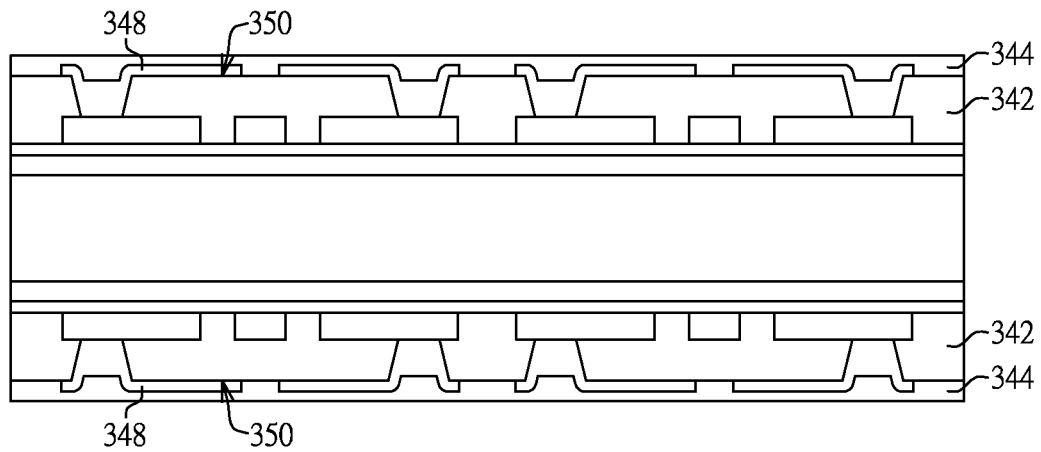

Referring to FIG. 15B, a second dielectric layer 344 is disposed on the third dielectric surface 350 of the first dielectric layer 342 and the second patterned conductive layer 348. In an embodiment, the second dielectric layer 344 is a solder mask formed by coating; however, the present disclosure is not limited thereto.

Figure 15C:
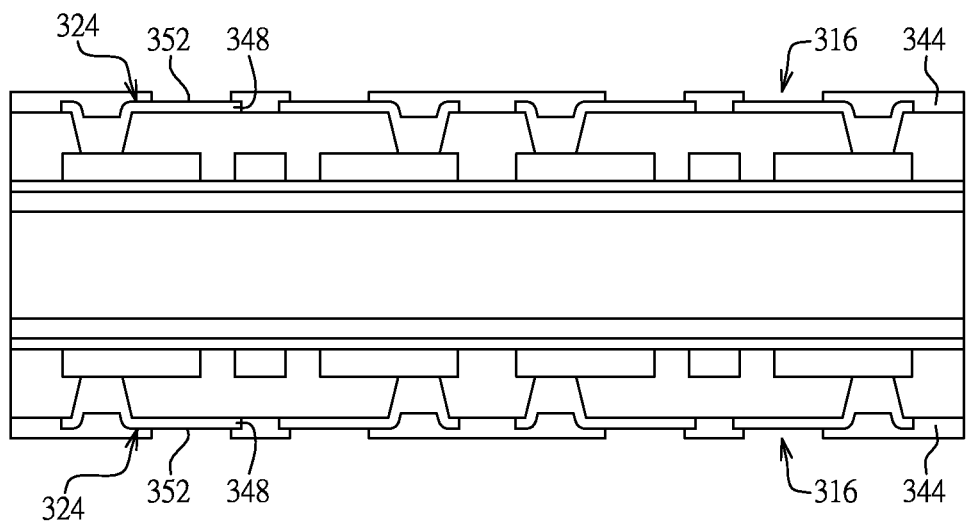

Referring to FIG. 15C, the second dielectric layer 344 is patterned so as to form one or more dielectric openings 316 in the second dielectric layer 344, so that a second conductive surface 324 of the second patterned conductive layer 348 is exposed, thereby exposing a second bonding pad (ball pad) 352.

Figure 15D:
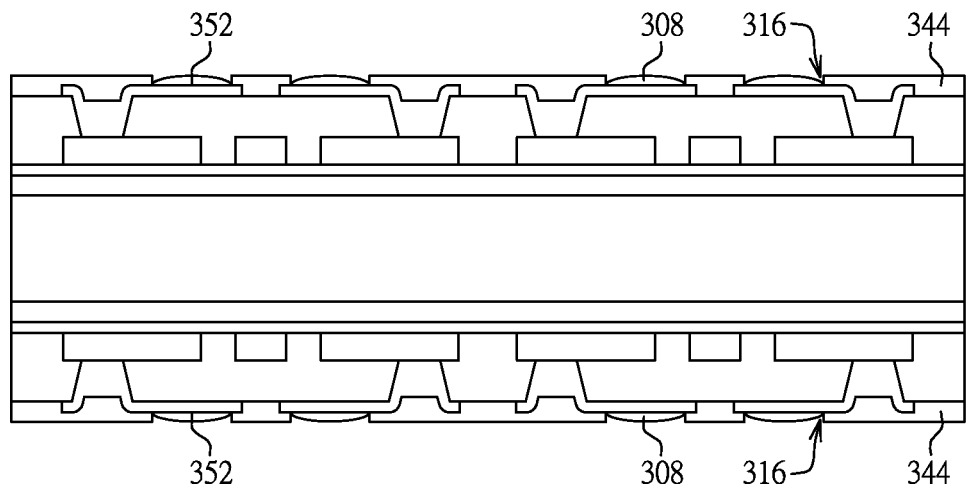

Referring to FIG. 15D, the metal bumps 308 are formed on the second bonding pads (ball pad) 352 exposed by the dielectric openings 316 of the second dielectric layer 344 by, for example, plating.

Figure 15E:
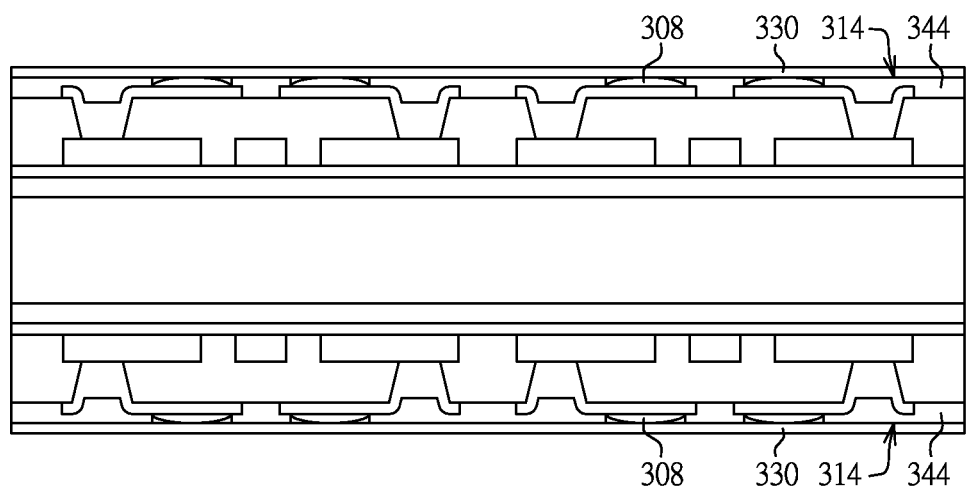

Referring to FIG. 15E, a supporting structure 330 (for example, a metal supporting layer) is disposed on a second dielectric surface 314 of the second dielectric layer 344, and covers the metal bumps 308.

Figure 15F:
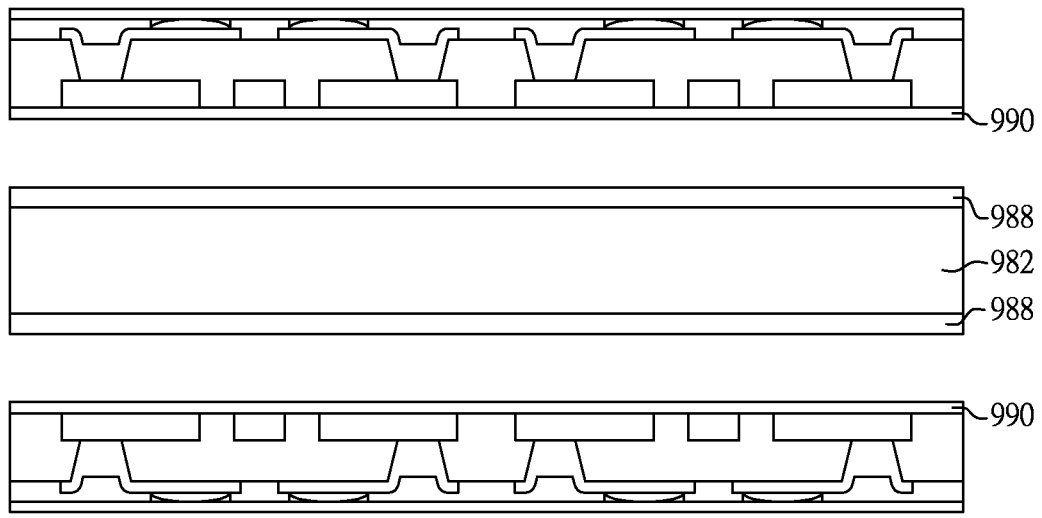

Referring to FIG. 15F, the conductive film 990 is separated from the conductive film 988, so that the upper substrate structure and the lower substrate structure are separated from the first carrier 982.

Figure 15G:
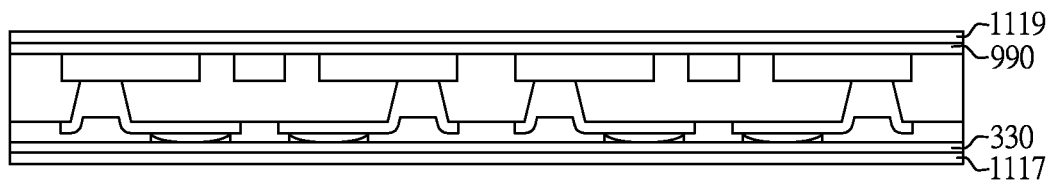

Referring to FIG. 15G, since the substrate structure includes the supporting structure 330, its strength and rigidity are enhanced during subsequent packaging, which can improve yield. Meanwhile, a photoresist layer 1117 is disposed on the supporting structure 330, and a photoresist layer 1119 is disposed on the conductive film 990. In one embodiment, the photoresist layers 1117, 1119 are laminated dry films; however, the present disclosure is not limited thereto.

Figure 15H:
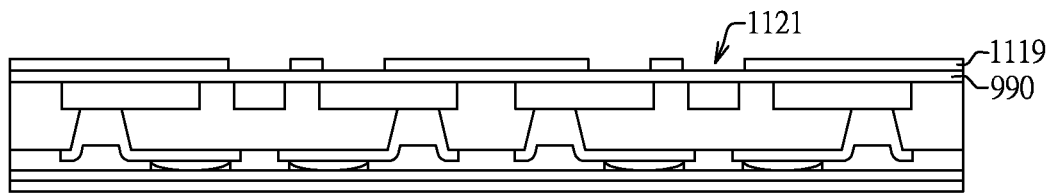

Referring to FIG. 15H, the photoresist layer 1119 is patterned so that one or more openings 1121 are defined in the photoresist layer 1119, and the conductive film 990 is exposed.

Figure 15I:
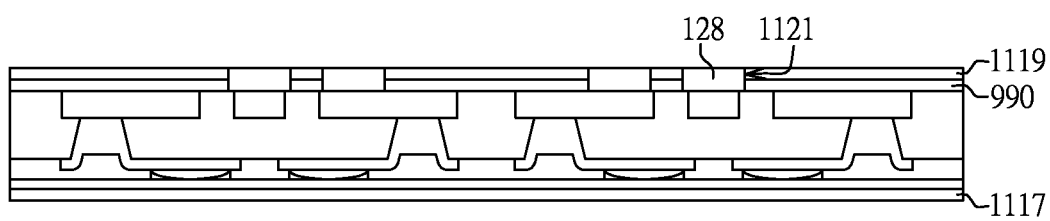

Referring to FIG. 15I, one or more conductive posts 128 are formed on the conductive film 990 exposed by the openings 1121 of the photoresist layer 1119 by, for example, plating.

Figure 15J:
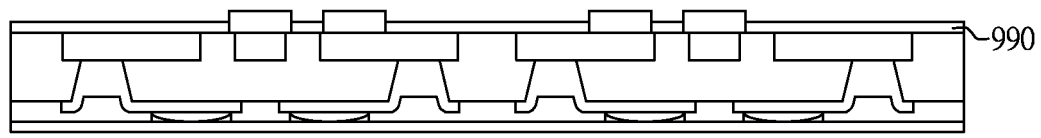

Referring to FIG. 15J, the photoresist layer 1117 and the photoresist layer 1119 as shown FIG. 15I are removed.

Figure 15K:
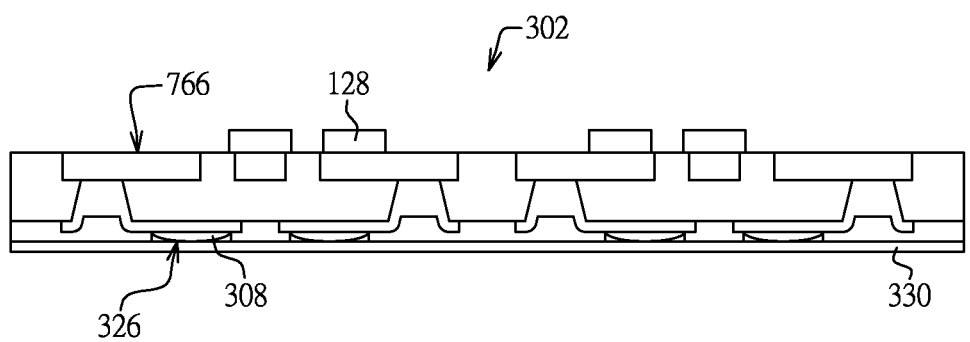

Referring to FIG. 15K, the conductive film 990 as shown in FIG. 15J may be removed by flash etching or other suitable technique. After this point, the semiconductor substrate structure 302 is obtained. It is noted that the above process may not include the formation of the conductive posts 128. In addition, the upper substrate structure and the lower substrate structure are manufactured on two sides of the first carrier 982, thus, the metal bumps 308 of the upper substrate structure and the lower substrate structure are plated simultaneously, which can improve the efficiency.

Figure 15L:
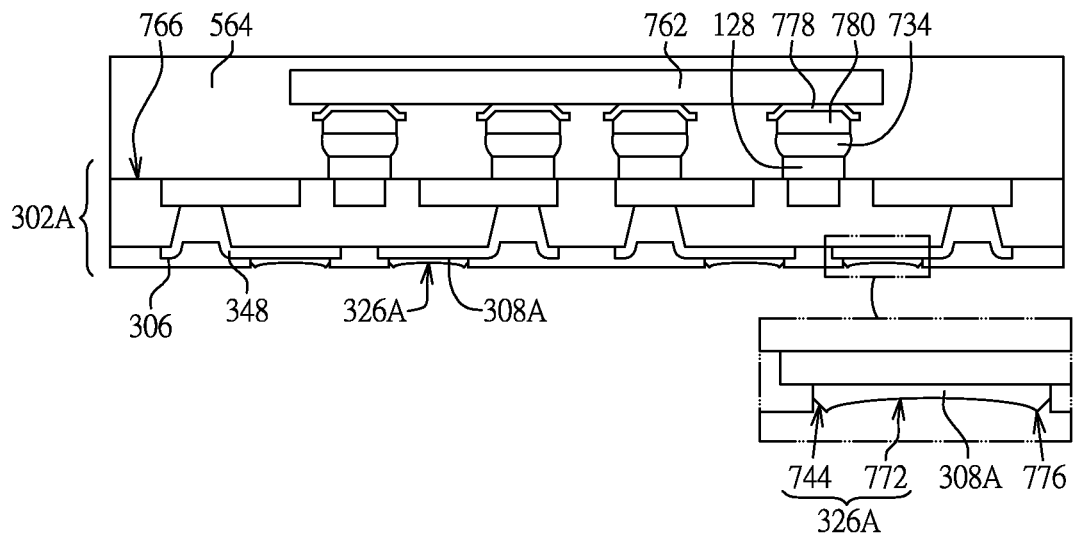

Referring to FIG. 15L, the semiconductor die 762 is provided. The semiconductor die 762 includes one or more bonding pads 778 on the active surface thereof and one or more conductive pillars 780 disposed on respective ones of the bonding pads 778. The semiconductor die 762 is electrically and physically connected to the conductive posts 128 of the semiconductor substrate structure 302 (FIG. 15K) through the solder 734 on the conductive pillars 780. An encapsulant 564 covers the semiconductor die 762, the conductive pillars 780, the solder 734, the conductive posts 128 and a portion of the first substrate surface 766 of the semiconductor substrate structure 302. In this embodiment, the conductive pillars 780 and the conductive posts 128 form a sufficiently large space, so that the encapsulant 564 can be fully filled to cover all the elements on the active surface of the semiconductor die 762. Thus, expensive underfill is unnecessary, thereby reducing manufacturing cost.

Referring to FIG. 15L, after molding, the supporting structure 330 as shown in FIG. 15K is removed. In one embodiment, the supporting structure 330 is removed by etching; however, the present disclosure is not limited thereto. For example, the supporting structure 330 is removed by flash etching; meanwhile, the metal bumps 308 are simultaneously flash etched, so that the bump surfaces 326 (originally convex curved surface) will be partially etched to form the bump surfaces 326A, so as to form the metal bumps 308A. The metal bumps 308A can protect the second patterned conductive layer 348 of the conductive structure 306 from being etched, thus, the thickness of the second patterned conductive layer 348 is maintained. The bump surfaces 326A of the metal bumps 308A include a concave surface 772 and a side surface 774 adjacent to the concave surface 772. The concave surface 772 and the side surface 774 intersect at a protrusion portion 776. After this point, the semiconductor substrate structure 302 (FIG. 15K) becomes the semiconductor substrate structure 302A (FIG. 15L).

Figure 15M:
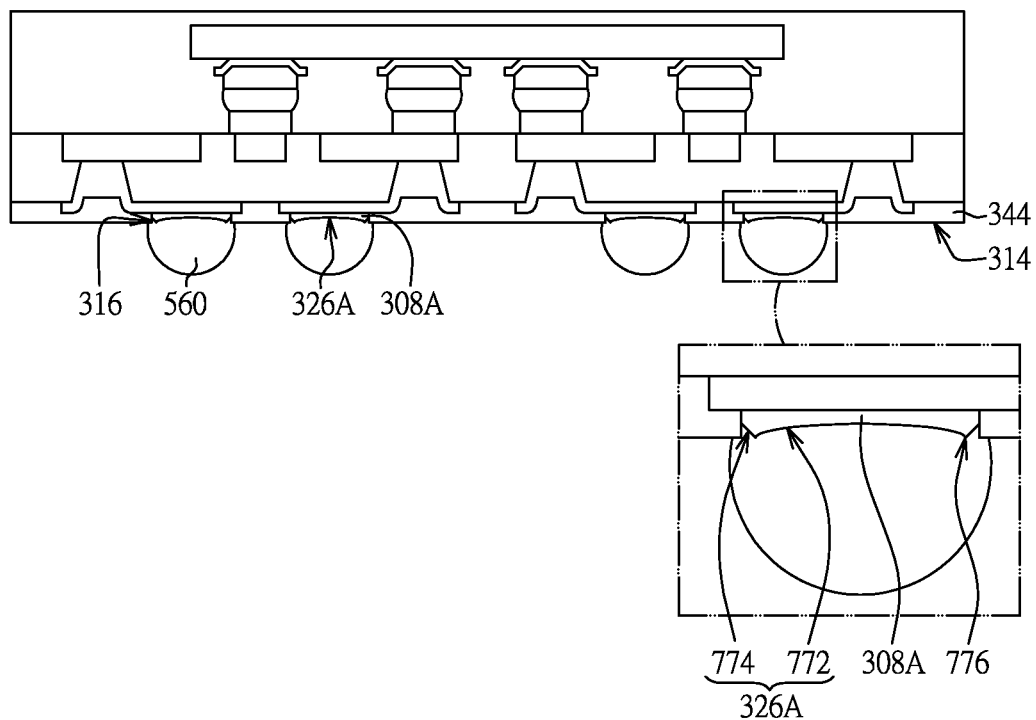

Referring to FIG. 15M, the solder bumps 560 are disposed in the dielectric openings 316 of the second dielectric layer 344, and are physically and electrically connected to the bump surfaces 326A of the metal bumps 308A. In addition, the solder bumps 560 protrude from the second dielectric surface 314 of the second dielectric layer 344. After this point, the semiconductor package 770 is obtained.

FIG. 16A, FIG. 16B, FIG. 16C, FIG. 16D, FIG. 16E, FIG. 16F, FIG. 16G, FIG. 16H, FIG. 16I, FIG. 16J, FIG. 16K, FIG. 16L, FIG. 16M and FIG. 16N illustrate a method of manufacturing a semiconductor package according to another embodiment of the present disclosure. The initial steps of this embodiment are same as FIG. 15A to FIG. 15C, and the following steps are subsequent to FIG. 15C.

Figure 16A:
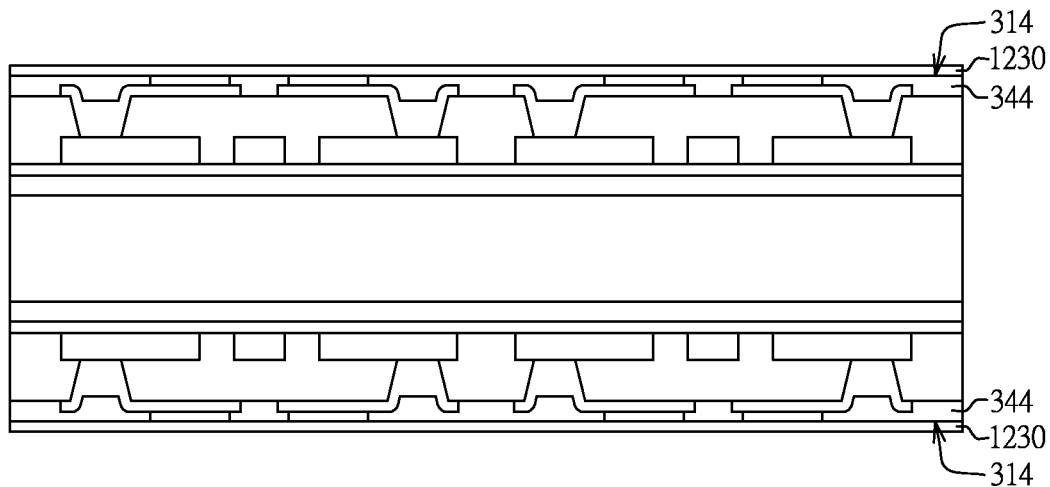
FIG. 16A, FIG. 16B, FIG. 16C, FIG. 16D, FIG. 16E, FIG. 16F, FIG. 16G, FIG. 16H, FIG. 16I, FIG. 16J, FIG. 16K, FIG. 16L, FIG. 16M and FIG. 16N illustrate a method of manufacturing a semiconductor package according to another embodiment of the present disclosure.

Referring to FIG. 16A, a supporting structure 1230 (for example, a metal supporting layer) is disposed on a second dielectric surface 314 of the second dielectric layer 344.

Figure 16B:
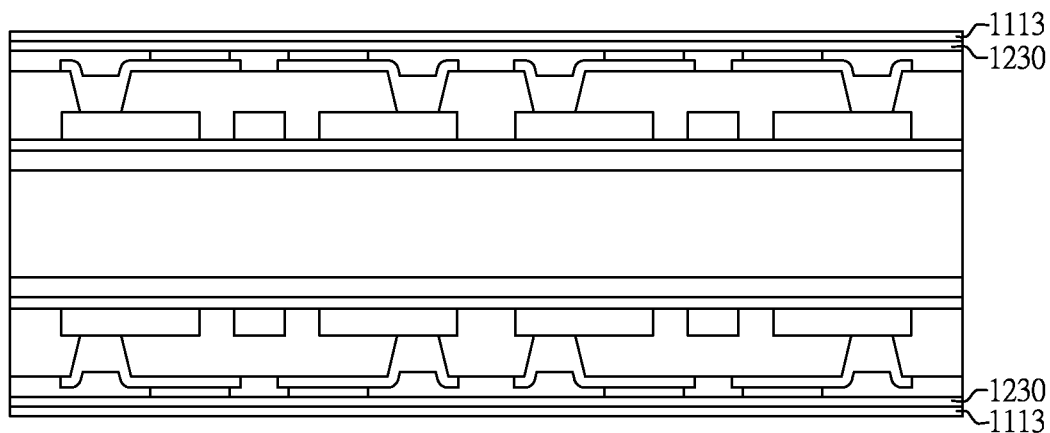

Referring to FIG. 16B, a photoresist layer 1113 is disposed on the supporting structure 1230. In one embodiment, the photoresist layer 1113 is a laminated dry film; however, the present disclosure is not limited thereto.

Figure 16C:
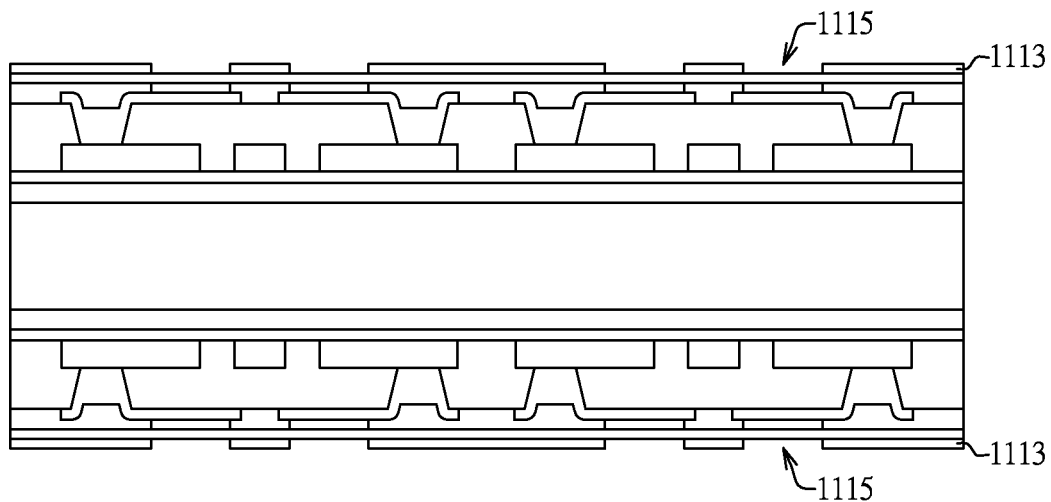

Referring to FIG. 16C, the photoresist layer 1113 is patterned so that one or more openings 1115 are defined in the photoresist layer 1113.

Figure 16D:
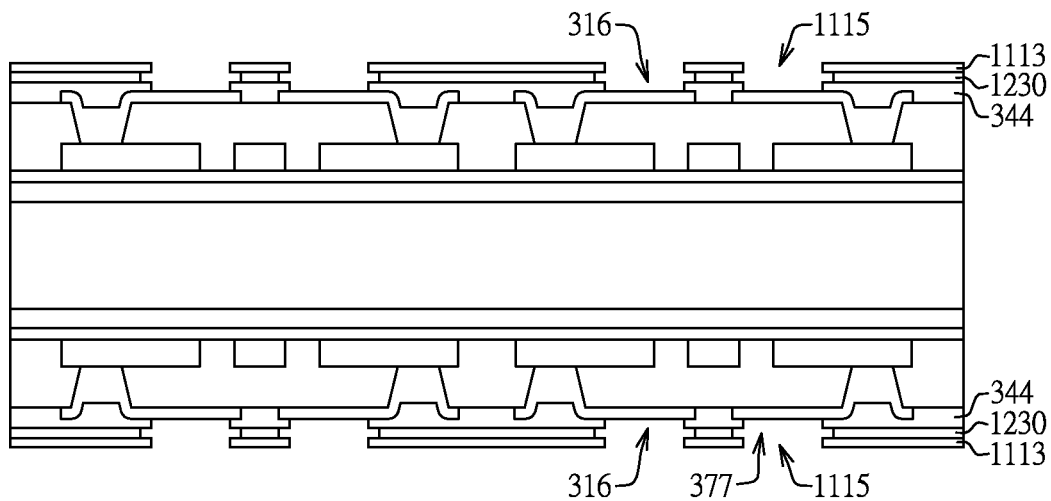

Referring to FIG. 16D, a portion of the supporting structure 1230 exposed by the openings 1115 of the photoresist layer 1113 is removed, so that one or more conductive openings 377 are formed in the metal supporting layer 1230. Meanwhile, the second dielectric layer 344 is exposed.

Figure 16E:
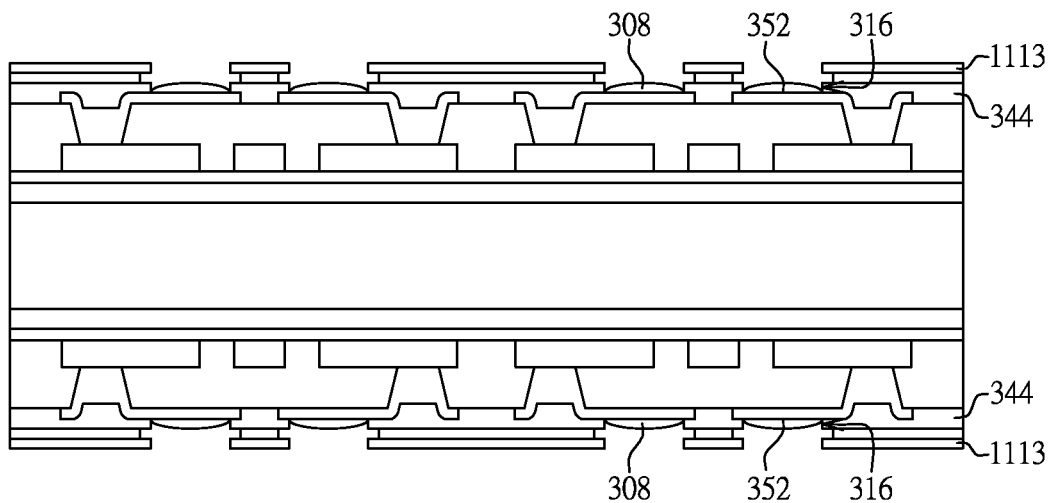

Referring to FIG. 16E, one or more metal bumps 308 are formed on respective ones of second bonding pads (ball pad) 352 exposed by the dielectric openings 316 of the second dielectric layer 344 by, for example, plating.

Figure 16F:
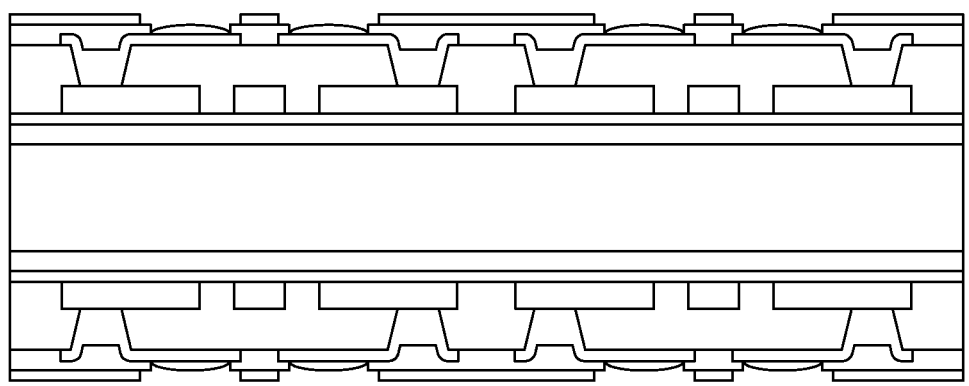

Referring to FIG. 16F, the photoresist layer 1113 as shown FIG. 16E is removed.

Figure 16G:
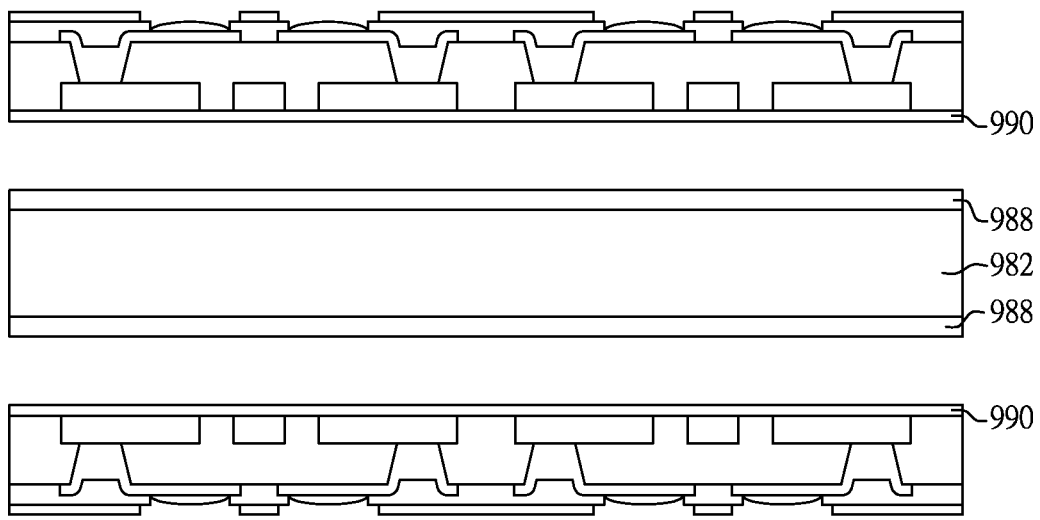

Referring to FIG. 16G, the conductive film 990 is separated from the conductive film 988, so that the upper substrate structure and the lower substrate structure are separated from the first carrier 982.

Figure 16H:
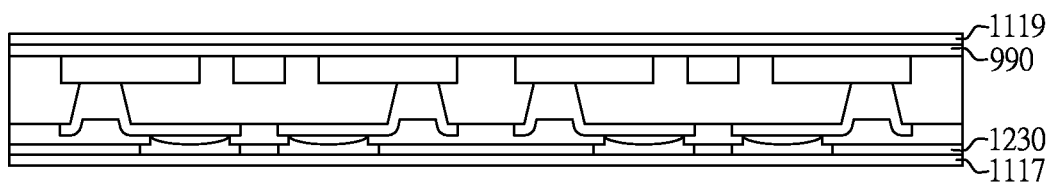

Referring to FIG. 16H, since the substrate structure includes the supporting structure 1230, its strength and rigidity are enhanced during subsequent packaging, which can improve yield. Meanwhile, a photoresist layer 1117 is disposed on the supporting structure 1230, and a photoresist layer 1119 is disposed on the conductive film 990. In one embodiment, the photoresist layers 1117, 1119 are laminated dry films; however, the present disclosure is not limited thereto.

Figure 16I:
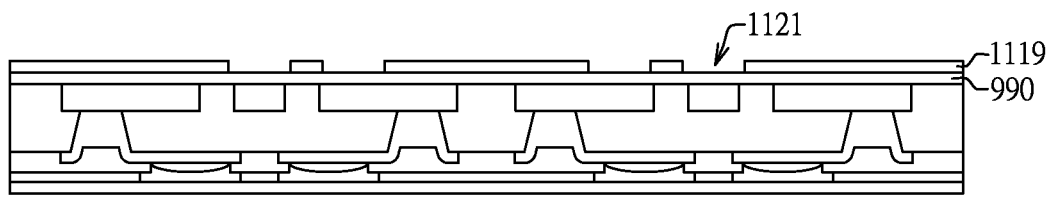

Referring to FIG. 16I, the photoresist layer 1119 is patterned so that one or more openings 1121 are defined in the photoresist layer 1119, and the conductive film 990 is exposed.

Figure 16J:
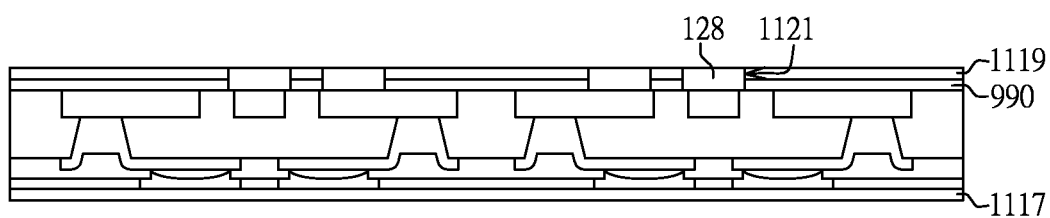

Referring to FIG. 16J, one or more conductive posts 128 are formed on the conductive film 990 exposed by the opening 1121 of the photoresist layer 1119 by, for example, plating.

Figure 16K:
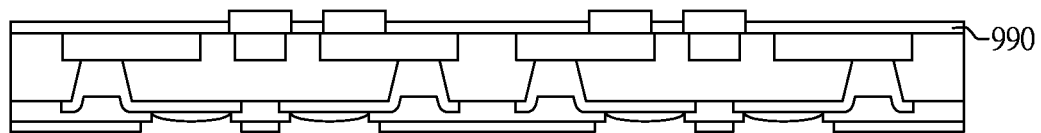

Referring to FIG. 16K, the photoresist layer 1117 and the photoresist layer 1119 as shown FIG. 16J are removed.

Figure 16L:
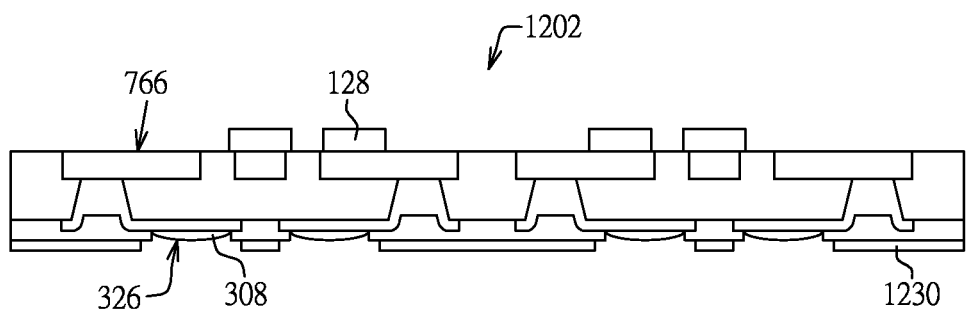

Referring to FIG. 16L, the conductive film 990 as shown in FIG. 16K is removed. The conductive film 990 is removed by flash etching or other suitable technique. After this point, the semiconductor substrate structure 1202 is obtained. It is noted that the above process may not include the formation of the conductive posts 128. In addition, the upper substrate structure and the lower substrate structure are manufactured on two sides of the first carrier 982, thus, the metal bumps 308 of the upper substrate structure and the lower substrate structure are plated simultaneously, which can improve the efficiency.

Figure 16M:
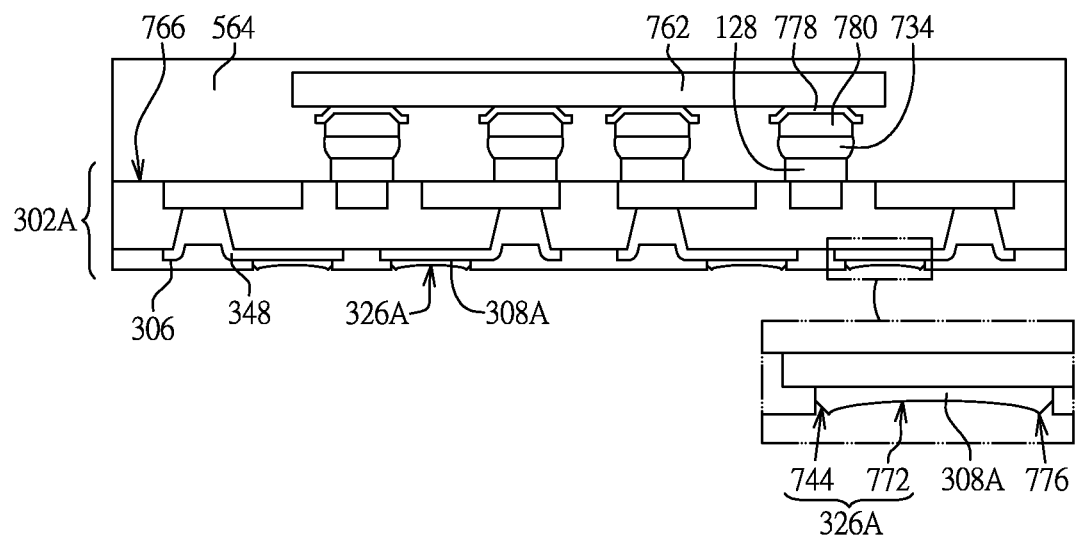

Referring to FIG. 16M, a semiconductor die 762 is provided. The semiconductor die 762 includes one or more bonding pads 778 on the active surface thereof and one or more conductive pillars 780 disposed on respective ones of the bonding pads 778. The semiconductor die 762 is electrically and physically connected to the conductive posts 128 of the semiconductor substrate structure 1202 (FIG. 16L) through the solder 734 on the conductive pillars 780. An encapsulant 564 covers the semiconductor die 762, the conductive pillars 780, the solder 734, the conductive posts 128 and a portion of the first substrate surface 766 of the semiconductor substrate structure 1202. In this embodiment, the conductive pillars 780 and the conductive posts 128 form a sufficiently large space, so that the encapsulant 564 can be fully filled to cover all the components on the active surface of the semiconductor die 762. Thus, expensive underfill is unnecessary, thereby reducing manufacturing cost.

Referring to FIG. 16M, after molding, the supporting structure 1230 as shown in FIG. 16L is removed. In one embodiment, the supporting structure 1230 is a metal supporting layer removed by etching; however, the present disclosure is not limited thereto. For example, the metal supporting layer is removed by flash etching; meanwhile, the metal bumps 308 are simultaneously flash etched, so that the bump surfaces 326 (originally convex curved surface) will be partially etched to form the bump surfaces 326A, so as to form the metal bumps 308A. The metal bumps 308A can protect the second patterned conductive layer 348 of the conductive structure 306 from being etched, thus, the thickness of the second patterned conductive layer 348 is maintained. The bump surfaces 326A of the metal bumps 308A include a concave surface 772 and a side surface 774 adjacent to the concave surface 772. The concave surface 772 and the side surface 774 intersect at a protrusion portion 776. After this point, the semiconductor substrate structure 1202 (FIG. 16L) becomes the semiconductor substrate structure 302A.

Figure 16N:
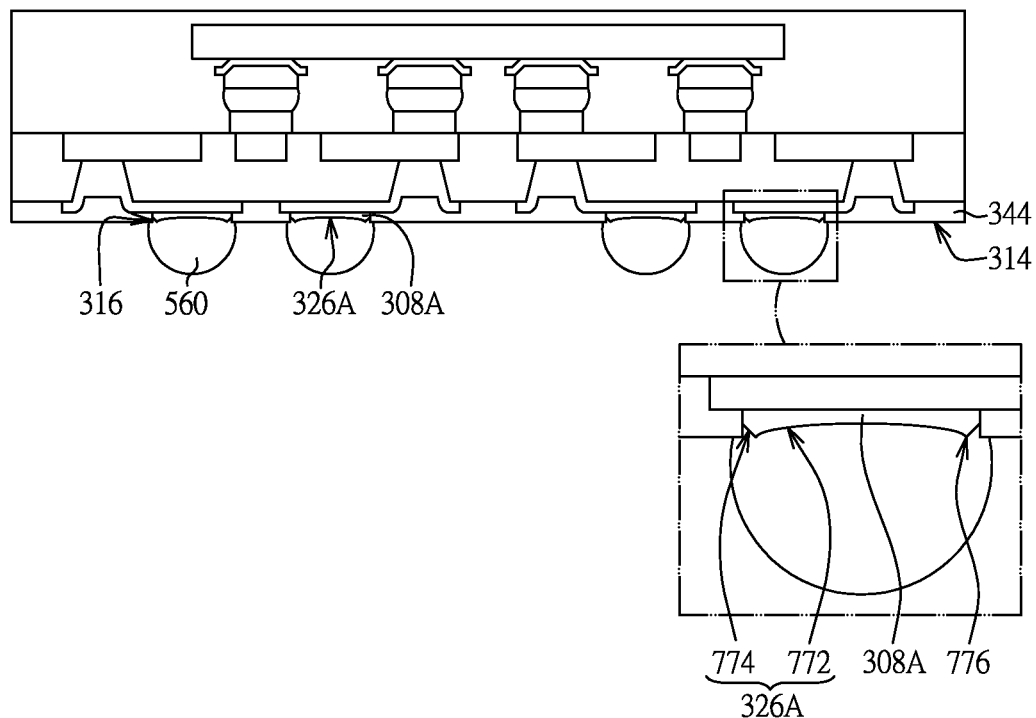

Referring to FIG. 16N, one or more solder bumps 560 are disposed in the dielectric openings 316 of the second dielectric layer 344, and are physically and electrically connected to the bump surfaces 326A of the metal bumps 308A. In addition, the solder bumps 560 protrude from the second dielectric surface 314 of the second dielectric layer 344. After this point, the semiconductor package 770 is obtained.

As used herein and not otherwise defined, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Two surfaces can be deemed to be coplanar or substantially coplanar if a displacement between the two surfaces is, for example, no greater than 1 μm, no greater than 0.5 μm, or no greater than 0.2 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor substrate structure, comprising:
   a conductive structure having a first conductive surface and a second conductive surface opposite to the first conductive surface;
   a dielectric structure covering at least a portion of the conductive structure, and having a first dielectric surface and a second dielectric surface opposite to the first dielectric surface, wherein the dielectric structure is a homogeneous dielectric layer, and wherein the first conductive surface does not protrude from the first dielectric surface, the second conductive surface is recessed from the second dielectric surface, and the dielectric structure defines a dielectric opening on the second dielectric surface to expose a portion of the second conductive surface, wherein the dielectric structure is formed from a photo-sensitive resin; and
   a metal bump disposed in the dielectric opening, and physically and electrically connected to the second conductive surface, wherein the metal bump has a surface, and a gap is formed between the surface of the metal bump and the dielectric structure, wherein the surface of the metal bump is a convex surface, and the convex surface does not protrude from the second dielectric surface of the dielectric structure.

2. The semiconductor substrate structure according to claim 1, wherein the metal bump is recessed from the second dielectric surface.

3. The semiconductor substrate structure according to claim 1, wherein the gap is formed between the surface of the metal bump and the dielectric structure.

4. The semiconductor substrate structure according to claim 1, wherein the dielectric structure comprises a first patterned conductive layer and a second patterned conductive layer, the first patterned conductive layer has the first conductive surface exposed from the first dielectric surface, and the second patterned conductive layer has the second conductive surface exposed from the dielectric opening.

5. The semiconductor substrate structure according to claim 4, wherein the dielectric structure further comprises a conductive via extending through the dielectric structure and electrically connecting the first patterned conductive layer and the second patterned conductive layer.

6. The semiconductor substrate structure according to claim 1, further comprising a conductive post protruding from the first conductive surface.

7. A semiconductor package, comprising:
a semiconductor substrate structure, comprising:
a conductive structure having a first conductive surface and a second conductive surface opposite to the first conductive surface;
a dielectric structure covering at least a portion of the conductive structure, and having a first dielectric surface and a second dielectric surface opposite to the first dielectric surface, wherein the dielectric structure is a homogeneous dielectric layer, and wherein the first conductive surface does not protrude from the first dielectric surface, the second conductive surface is recessed from the second dielectric surface, and the dielectric structure defines a dielectric opening on the second dielectric surface to expose a portion of the second conductive surface, wherein the dielectric structure is formed from a photo-sensitive resin; and
a metal bump disposed in the dielectric opening, and physically and electrically connected to the second conductive surface, wherein the metal bump has a surface, and a gap is formed between the surface of the metal bump and the dielectric structure;
a semiconductor die electrically connected to the first conductive surface of the conductive structure; and
an encapsulant, covering the semiconductor die and a portion of the semiconductor substrate structure, wherein
the surface of the metal bump is a convex surface, and the convex surface does not protrude from the second dielectric surface of the dielectric structure.

8. The semiconductor package according to claim 7, wherein the metal bump is recessed from the second dielectric surface.

9. The semiconductor package according to claim 7, wherein the semiconductor substrate structure further comprises a conductive post protruding from the first conductive surface and electrically connected to the semiconductor die.

10. A semiconductor package, comprising:
a dielectric structure defining openings at a first surface of the dielectric structure;
a patterned conductive layer embedded in the dielectric structure, the patterned conductive layer comprising first bonding pads on a first surface of the patterned conductive layer, the patterned conductive layer further comprising second bonding pads and traces on a second surface of the patterned conductive layer, the openings in the dielectric structure exposing the first bonding pads, and a second surface of the dielectric structure exposing the second bonding pads and the traces;
a conductive post disposed on one of the second bonding pads;
a semiconductor die electrically connected to the conductive post, the semiconductor die comprising sidewalls;
a metal bump disposed on one of the first bonding pads, wherein the metal bump has a surface, and a gap is formed between the surface of the metal bump and the dielectric structure; and
an encapsulant, covering at least a portion of the sidewalls of the semiconductor die and the second surface of the dielectric structure, wherein
the surface of the metal bump is a convex surface, and the convex surface does not protrude from the second surface of the dielectric structure.

11. The semiconductor package of claim 10, wherein the dielectric structure is formed from a photo-sensitive resin.

12. The semiconductor package of claim 10, further comprising a supporting structure disposed on the first surface of the dielectric structure.

13. The semiconductor package of claim 12, wherein the supporting structure is a metal layer.

14. The semiconductor package of claim 12, further comprising at least one thermal pad disposed on the supporting structure.

15. The semiconductor package of claim 10, wherein the metal bump is recessed from the first surface of the dielectric structure.

16. The semiconductor package of claim 10, wherein the second bonding pads and traces are recessed from the second surface of the dielectric structure.

17. The semiconductor package of claim 10, further comprising a conductive film disposed under the conductive post.

18. The semiconductor substrate structure according to claim 9, further comprising a solder bump disposed on the surface of the metal bump.

19. The semiconductor substrate structure according to claim 1, wherein no traces are disposed on the second dielectric surface.

20. The semiconductor substrate structure according to claim 1, wherein the conductive structure is a single-layered structure, and the dielectric structure is a single-layered structure.

21. The semiconductor substrate structure according to claim 20, further comprising a single-layered second conductive structure and a single-layered second dielectric structure, wherein the second conductive structure has a third conductive surface opposite to the first conductive surface, the second dielectric structure has a third dielectric surface opposite to the first dielectric surface, the third conductive surface is recessed from the third dielectric surface and exposed from a second dielectric opening on the third dielectric surface.

22. The semiconductor package according to claim 7, wherein no traces are disposed on the second dielectric surface.

23. The semiconductor package according to claim 7, wherein the conductive structure is a single-layered structure, and the dielectric structure is a single-layered structure.

24. The semiconductor package of claim 10, wherein no traces are disposed on the first surface of the dielectric structure.

25. The semiconductor package of claim 10, wherein the patterned conductive layer is a single-layered structure.

* * * * *